(12) United States Patent
Kasichainula

(10) Patent No.: US 10,141,492 B2
(45) Date of Patent: Nov. 27, 2018

(54) ENERGY HARVESTING FOR WEARABLE TECHNOLOGY THROUGH A THIN FLEXIBLE THERMOELECTRIC DEVICE

(71) Applicant: Sridhar Kasichainula, Fremont, CA (US)

(72) Inventor: Sridhar Kasichainula, Fremont, CA (US)

(73) Assignee: NIMBUS MATERIALS INC., Fremont, CA (US)

( * ) Notice: Subject to any disclaimer, the term of this patent is extended or adjusted under 35 U.S.C. 154(b) by 0 days.

(21) Appl. No.: 14/711,810

(22) Filed: May 14, 2015

(65) Prior Publication Data

US 2016/0336501 A1 Nov. 17, 2016

(51) Int. Cl.
*H01L 35/32* (2006.01)
*H01L 35/30* (2006.01)
*H01L 35/34* (2006.01)

(52) U.S. Cl.
CPC .............. *H01L 35/32* (2013.01); *H01L 35/30* (2013.01); *H01L 35/34* (2013.01)

(58) Field of Classification Search
CPC .......................................... H01L 35/00–35/34
USPC .................................................. 136/200–242
See application file for complete search history.

(56) References Cited

U.S. PATENT DOCUMENTS

| 3,081,361 A | 3/1963 | Henderson et al. |
| 3,197,342 A | 7/1965 | Neild, Jr. |
| 3,458,356 A | 7/1969 | Kummer et al. |
| 3,508,968 A | 4/1970 | Ovshinsky |
| 3,554,815 A * | 1/1971 | Osborn .................... H01L 35/00 136/203 |
| 3,618,590 A * | 11/1971 | Frank ..................... A61B 18/02 219/241 |
| 3,648,152 A | 3/1972 | Katsunori |
| 3,666,566 A | 5/1972 | Flaherty |
| 3,851,381 A | 12/1974 | Alais et al. |

(Continued)

FOREIGN PATENT DOCUMENTS

| CN | 1505252 A | 6/2004 |
| CN | 1975448 A | 6/2007 |

(Continued)

OTHER PUBLICATIONS

Parylene Conformal Coating Specifications and Properties, Evidentiary Reference.*

(Continued)

*Primary Examiner* — Liesl C Baumann
(74) *Attorney, Agent, or Firm* — LegalForce RAPC Worldwide

(57) ABSTRACT

A method and/or apparatus of energy harvesting for wearable technology through a thin flexible thermoelectric device is disclosed. A lower conduction layer is deposited onto a lower dielectric layer. An active layer, comprising at least one thin film thermoelectric conduit and a thermal insulator, is above the lower conduction layer. An internal dielectric layer is deposited above the active layer, and conduit holes are drilled above each thermoelectric conduit. An upper conduction layer and upper dielectric layer are deposited, connecting the thermoelectric conduits in series. The resulting flexible thermoelectric device generates a voltage when exposed to a temperature gradient.

13 Claims, 8 Drawing Sheets

(56) References Cited

U.S. PATENT DOCUMENTS

| | | | |
|---|---|---|---|
| 3,995,429 A | 12/1976 | Peters |
| 4,036,665 A | 7/1977 | Barr et al. |
| 4,039,352 A | 8/1977 | Marinescu |
| 4,095,998 A | 6/1978 | Hanson |
| 4,106,279 A | 8/1978 | Martin et al. |
| 4,125,122 A | 11/1978 | Stachurski |
| 4,213,292 A | 7/1980 | Dolezal et al. |
| 4,251,291 A | 2/1981 | Gomez |
| 4,338,560 A | 7/1982 | Lemley |
| 4,382,154 A | 5/1983 | Thery et al. |
| 4,443,650 A | 4/1984 | Takagi et al. |
| 4,448,028 A | 5/1984 | Chao et al. |
| 4,467,611 A | 8/1984 | Nelson et al. |
| 4,497,973 A | 2/1985 | Heath et al. |
| 4,551,857 A | 11/1985 | Galvin |
| 4,673,863 A | 6/1987 | Swarbrick |
| 4,946,511 A | 8/1990 | Shiloh et al. |
| 5,180,928 A | 1/1993 | Choi |
| 5,286,304 A | 2/1994 | Macris et al. |
| 5,419,780 A | 5/1995 | Suski |
| 5,427,086 A | 6/1995 | Brownell |
| 5,521,375 A | 5/1996 | Jang |
| 5,554,819 A | 9/1996 | Baghai-Kermani |
| 5,563,368 A | 10/1996 | Yamaguchi |
| 5,625,245 A | 4/1997 | Bass |
| 5,705,770 A | 1/1998 | Ogasawara et al. |
| 5,712,448 A | 1/1998 | Vandersande et al. |
| 5,817,188 A | 10/1998 | Yahatz et al. |
| 5,889,735 A | 3/1999 | Kawata et al. |
| 5,892,656 A | 4/1999 | Bass |
| 5,929,372 A | 7/1999 | Oudoire et al. |
| 5,950,067 A | 9/1999 | Maegawa et al. |
| 5,959,240 A | 9/1999 | Yoshida et al. |
| 6,043,423 A | 3/2000 | Satomura et al. |
| 6,066,902 A | 5/2000 | Maurio et al. |
| 6,075,199 A | 6/2000 | Wong |
| 6,166,317 A | 12/2000 | Volk, Jr. |
| 6,207,887 B1 | 3/2001 | Bass et al. |
| 6,271,459 B1 | 8/2001 | Yoo |
| 6,281,594 B1 | 8/2001 | Sarich |
| 6,300,150 B1 | 10/2001 | Venkatasubramanian |
| 6,304,520 B1 | 10/2001 | Watanabe |
| 6,307,142 B1 | 10/2001 | Allen et al. |
| 6,313,393 B1 | 11/2001 | Drost |
| 6,314,741 B1 | 11/2001 | Hiraishi |
| 6,320,280 B1 | 11/2001 | Kanesaka |
| 6,329,217 B1 | 12/2001 | Watanabe et al. |
| 6,367,261 B1 | 4/2002 | Marshall et al. |
| 6,407,965 B1 | 6/2002 | Matoge et al. |
| 6,410,971 B1 | 6/2002 | Otey |
| 6,426,921 B1 | 7/2002 | Mitamura |
| 6,433,465 B1 | 8/2002 | McKnight et al. |
| 6,548,894 B2 | 4/2003 | Chu et al. |
| 6,598,405 B2 | 7/2003 | Bell |
| 6,605,773 B2 | 8/2003 | Kok et al. |
| 6,620,994 B2 | 9/2003 | Rossi |
| 6,700,310 B2 | 3/2004 | Maue et al. |
| 6,729,183 B2 | 5/2004 | Tanimoto et al. |
| 6,846,983 B1 | 1/2005 | Warehime |
| 6,870,766 B2 | 3/2005 | Cho et al. |
| 6,882,128 B1 | 4/2005 | Rahmel et al. |
| 6,914,343 B2 | 7/2005 | Hiller et al. |
| 7,081,693 B2 | 7/2006 | Hamel et al. |
| 7,282,384 B2 | 10/2007 | Shin et al. |
| 7,360,365 B2 | 4/2008 | Codecasa et al. |
| 7,397,169 B2 | 7/2008 | Nersessian et al. |
| 7,400,050 B2 | 7/2008 | Jovanovic et al. |
| 7,488,888 B2 | 2/2009 | Mitchell et al. |
| 7,493,766 B2 | 2/2009 | Yang et al. |
| 7,532,937 B2 | 5/2009 | Horio et al. |
| 7,649,139 B2 | 1/2010 | Mihara et al. |
| 7,770,645 B2 | 8/2010 | Jeffryes |
| 7,777,126 B2 | 8/2010 | Chu |
| 7,800,194 B2 | 9/2010 | Freedman |
| 7,800,278 B2 | 9/2010 | Ujihara et al. |
| 7,834,263 B2 | 11/2010 | DeSteese et al. |
| 7,851,691 B2 | 12/2010 | DeSteese et al. |
| 7,851,932 B2 | 12/2010 | Rome et al. |
| 7,878,283 B2 | 2/2011 | Richter et al. |
| 7,939,743 B2 | 5/2011 | Leng et al. |
| 8,046,993 B2 | 11/2011 | Kao |
| 8,216,871 B2 | 7/2012 | McCann |
| 8,237,043 B2 | 8/2012 | Kondoh |
| 8,269,097 B2 | 9/2012 | Asatani et al. |
| 8,269,098 B2 | 9/2012 | Chu |
| 8,294,020 B2 | 10/2012 | Mitchell et al. |
| 8,404,959 B2 | 3/2013 | Donley |
| 8,404,960 B2 | 3/2013 | Prather et al. |
| 8,421,313 B2 | 4/2013 | Shih et al. |
| 8,421,403 B2 | 4/2013 | Newman |
| 8,519,505 B2 | 8/2013 | Hiroshige et al. |
| 8,519,595 B2 | 8/2013 | Hunter et al. |
| 8,594,803 B2 | 11/2013 | Magdych |
| 8,604,571 B2 | 12/2013 | Uchida et al. |
| 8,653,357 B2 | 2/2014 | Prather et al. |
| 8,685,758 B2 | 4/2014 | Suzuki et al. |
| 8,777,441 B2 | 7/2014 | Vazquez |
| 8,802,964 B2 | 8/2014 | Meng et al. |
| 8,948,870 B2 | 2/2015 | Imran |
| 8,952,235 B2 | 2/2015 | Span et al. |
| 8,975,503 B2 | 3/2015 | Mitchell et al. |
| 9,215,905 B2 | 12/2015 | Tseng |
| 9,224,936 B2 | 12/2015 | Nakamura et al. |
| 9,431,593 B2 | 8/2016 | Kato et al. |
| 9,455,390 B2 | 9/2016 | Kurihara et al. |
| 2002/0047489 A1 | 4/2002 | Oudakker |
| 2002/0117198 A1 | 8/2002 | Kok et al. |
| 2002/0148235 A1 | 10/2002 | Bell |
| 2003/0223919 A1 | 12/2003 | Kwak et al. |
| 2004/0045594 A1 | 3/2004 | Hightower |
| 2004/0094192 A1 | 5/2004 | Luo |
| 2004/0177876 A1 | 9/2004 | Hightower |
| 2004/0183306 A1 | 9/2004 | Rome |
| 2004/0238022 A1 | 12/2004 | Hiller et al. |
| 2005/0000559 A1 | 1/2005 | Horio et al. |
| 2005/0022855 A1 | 2/2005 | Raver |
| 2005/0087222 A1 | 4/2005 | Muller-Werth |
| 2005/0115600 A1 | 6/2005 | DeSteese et al. |
| 2005/0139248 A1 | 6/2005 | Strnad |
| 2005/0139250 A1 | 6/2005 | DeSteese et al. |
| 2005/0205125 A1 | 9/2005 | Nersessian et al. |
| 2005/0236028 A1 | 10/2005 | Strnad |
| 2006/0048807 A1 | 3/2006 | Lee et al. |
| 2006/0107990 A1 | 5/2006 | Adachi et al. |
| 2006/0118157 A1 | 6/2006 | Johnson et al. |
| 2006/0130888 A1 | 6/2006 | Yamaguchi et al. |
| 2006/0201161 A1 | 9/2006 | Hirai et al. |
| 2006/0207643 A1 | 9/2006 | Weaver et al. |
| 2006/0208492 A1 | 9/2006 | Jovanovic et al. |
| 2006/0243317 A1* | 11/2006 | Venkatasubramanian ............... H01L 35/00 136/206 |
| 2006/0254638 A1 | 11/2006 | Carmeli et al. |
| 2007/0000068 A1 | 1/2007 | Gerard France et al. |
| 2007/0028956 A1 | 2/2007 | Venkatasubramanian et al. |
| 2007/0056622 A1 | 3/2007 | Leng et al. |
| 2007/0095379 A1 | 5/2007 | Taher et al. |
| 2007/0125413 A1 | 6/2007 | Olsen et al. |
| 2007/0193617 A1 | 8/2007 | Taguchi |
| 2007/0283702 A1 | 12/2007 | Strnad |
| 2007/0290287 A1 | 12/2007 | Freedman |
| 2008/0017238 A1 | 1/2008 | Fei et al. |
| 2008/0065172 A1 | 3/2008 | Magdych |
| 2008/0066796 A1 | 3/2008 | Mitchell et al. |
| 2008/0092937 A1 | 4/2008 | Mitchell et al. |
| 2008/0173537 A1 | 7/2008 | DeSteese et al. |
| 2008/0264464 A1 | 10/2008 | Lee et al. |
| 2008/0283110 A1 | 11/2008 | Jin et al. |
| 2009/0000652 A1 | 1/2009 | von Windheim et al. |
| 2009/0025773 A1 | 1/2009 | Stark |
| 2009/0217960 A1 | 9/2009 | Tubel et al. |
| 2009/0260358 A1 | 10/2009 | Rapp et al. |
| 2009/0315335 A1 | 12/2009 | Ujihara et al. |
| 2010/0063557 A1 | 3/2010 | Imran |

(56) References Cited

U.S. PATENT DOCUMENTS

| | | |
|---|---|---|
| 2010/0065096 A1 | 3/2010 | Pellegrini |
| 2010/0154855 A1 | 6/2010 | Nemir et al. |
| 2010/0186399 A1 | 7/2010 | Huttinger |
| 2010/0257871 A1 | 10/2010 | Venkatasubramanian et al. |
| 2010/0300504 A1 | 12/2010 | Ceron Parisi et al. |
| 2010/0319745 A1 | 12/2010 | Meng et al. |
| 2011/0084349 A1 | 4/2011 | Uchida et al. |
| 2011/0094556 A1* | 4/2011 | Stark ............... H01L 35/32 136/205 |
| 2011/0139398 A1 | 6/2011 | Bauer et al. |
| 2011/0140458 A1 | 6/2011 | Arnold et al. |
| 2011/0169372 A1 | 7/2011 | Lim |
| 2011/0220162 A1* | 9/2011 | Siivola ............. H01L 35/32 136/203 |
| 2011/0220164 A1* | 9/2011 | Guha ............... C04B 35/547 136/225 |
| 2011/0275165 A1* | 11/2011 | Suzuki .............. H01L 35/08 438/4 |
| 2012/0000500 A1 | 1/2012 | Iida et al. |
| 2012/0081066 A1 | 4/2012 | Newman |
| 2012/0139076 A1* | 6/2012 | Shankar ............ H01L 23/38 257/467 |
| 2012/0160290 A1 | 6/2012 | Chen et al. |
| 2012/0192910 A1 | 8/2012 | Fowler et al. |
| 2012/0227779 A1 | 9/2012 | Miao et al. |
| 2012/0291425 A1 | 11/2012 | Mitchell et al. |
| 2012/0312343 A1 | 12/2012 | VanVechten et al. |
| 2013/0019460 A1 | 1/2013 | Mayes |
| 2013/0021002 A1 | 1/2013 | Mayes |
| 2013/0021788 A1 | 1/2013 | Mayes |
| 2013/0074897 A1* | 3/2013 | Yang ................ H01L 35/34 136/200 |
| 2013/0081663 A1* | 4/2013 | Yang ................ H01L 35/32 136/203 |
| 2013/0087180 A1 | 4/2013 | Stark et al. |
| 2013/0206199 A1 | 8/2013 | Lassiter et al. |
| 2013/0249301 A1 | 9/2013 | Smoot et al. |
| 2013/0298957 A1 | 11/2013 | Hiroshige et al. |
| 2014/0015470 A1 | 1/2014 | Lim et al. |
| 2014/0020728 A1 | 1/2014 | Chung |
| 2014/0090150 A1 | 4/2014 | Skertic |
| 2014/0096810 A1 | 4/2014 | Nakamura et al. |
| 2014/0137917 A1 | 5/2014 | Al-Merbati et al. |
| 2014/0159637 A1 | 6/2014 | Ebersold |
| 2014/0246066 A1 | 9/2014 | Chen et al. |
| 2014/0299169 A1 | 10/2014 | Schneider et al. |
| 2014/0326287 A1 | 11/2014 | Wiant et al. |
| 2014/0345666 A1 | 11/2014 | Konnai et al. |
| 2014/0348453 A1 | 11/2014 | Bartl et al. |
| 2014/0360548 A1 | 12/2014 | Bartl et al. |
| 2014/0373888 A1 | 12/2014 | Boukai et al. |
| 2014/0375246 A1 | 12/2014 | Boysen, III et al. |
| 2015/0048249 A1 | 2/2015 | Hedler et al. |
| 2015/0162517 A1 | 6/2015 | Kasichainula |
| 2015/0179912 A1* | 6/2015 | Maeshima ........ H01L 35/16 136/211 |
| 2015/0188019 A1 | 7/2015 | Corrado et al. |
| 2015/0214823 A1 | 7/2015 | Shastry et al. |
| 2015/0282227 A1 | 10/2015 | Yousef et al. |
| 2015/0324181 A1 | 11/2015 | Segal |
| 2016/0006123 A1 | 1/2016 | Li et al. |
| 2016/0233402 A1 | 8/2016 | Suda et al. |
| 2016/0336501 A1 | 11/2016 | Kasichainula |
| 2016/0367150 A1 | 12/2016 | Koch et al. |
| 2017/0012195 A1 | 1/2017 | Grishin |

FOREIGN PATENT DOCUMENTS

| | | |
|---|---|---|
| CN | 101454914 A | 6/2009 |
| CN | 201739025 U | 2/2011 |
| CN | 201781448 U | 3/2011 |
| CN | 201830182 U | 5/2011 |
| CN | 202005376 U | 10/2011 |
| CN | 102629842 A | 8/2012 |
| CN | 202602564 U | 12/2012 |
| CN | 102891635 A | 1/2013 |
| CN | 202651208 U | 1/2013 |
| CN | 202713203 U | 1/2013 |
| CN | 202978757 U | 6/2013 |
| CN | 203086385 U | 7/2013 |
| CN | 203119810 U | 8/2013 |
| CN | 103325935 A | 9/2013 |
| CN | 103554826 A | 1/2014 |
| CN | 204168184 U | 2/2015 |
| CN | 104638742 A | 5/2015 |
| CN | 103178754 B | 7/2015 |
| CN | 204669251 U | 9/2015 |
| DE | 2355863 A1 | 5/1974 |
| DE | 3735410 A1 | 5/1989 |
| DE | 3807633 A1 | 9/1989 |
| DE | 4118979 A1 | 12/1992 |
| DE | 4208358 A1 | 9/1993 |
| DE | 4313827 A1 | 11/1994 |
| DE | 19919023 A1 | 12/2000 |
| DE | 102006014414 A1 | 10/2007 |
| DE | 102006039024 A1 | 2/2008 |
| DE | 102006057662 A1 | 6/2008 |
| DE | 102008030758 A1 | 1/2009 |
| DE | 102008005334 A1 | 7/2009 |
| DE | 102008009979 A1 | 9/2009 |
| DE | 202010003713 U1 | 7/2010 |
| DE | 102008031266 B4 | 5/2013 |
| DE | 102007017461 B4 | 4/2014 |
| EP | 0644599 A2 | 3/1995 |
| EP | 0935334 A2 | 8/1999 |
| EP | 2764268 B1 | 8/2015 |
| JP | 2003102186 A | 4/2003 |
| JP | 3447915 B2 | 9/2003 |
| JP | 2005228160 A | 8/2005 |
| JP | 2006086510 A | 3/2006 |
| JP | 2013225550 A | 10/2013 |
| JP | 3196069 U | 2/2015 |
| KR | 20160109658 A | 9/2016 |
| WO | 1985005406 A1 | 12/1985 |
| WO | 1989007836 A1 | 8/1989 |
| WO | 1995030246 A1 | 11/1995 |
| WO | 1997045882 A1 | 12/1997 |
| WO | 1999007024 A1 | 2/1999 |
| WO | 1999010937 A1 | 3/1999 |
| WO | 2001082343 A2 | 11/2001 |
| WO | 2003007391 A1 | 1/2003 |
| WO | 2003015186 A2 | 2/2003 |
| WO | 2005086246 A2 | 9/2005 |
| WO | 2005098225 A1 | 10/2005 |
| WO | 2006003956 A1 | 1/2006 |
| WO | 2006110858 A2 | 10/2006 |
| WO | 2008013584 A2 | 1/2008 |
| WO | 2008134022 A2 | 11/2008 |
| WO | 2009151000 A1 | 12/2009 |
| WO | 2010048066 A2 | 4/2010 |
| WO | 2010101049 A1 | 9/2010 |
| WO | 2010113257 A1 | 10/2010 |
| WO | 2010138835 A2 | 12/2010 |
| WO | 2011091620 A1 | 8/2011 |
| WO | 2012130568 A1 | 10/2012 |
| WO | 2012165990 A1 | 12/2012 |
| WO | 2013050415 A1 | 4/2013 |
| WO | 2013108518 A1 | 7/2013 |
| WO | 2013109729 A1 | 7/2013 |
| WO | 2013135447 A1 | 9/2013 |
| WO | 2014064755 A1 | 5/2014 |
| WO | 2014082028 A1 | 5/2014 |
| WO | WO-2014199541 A1 * | 12/2014 ............ H01L 35/16 |
| WO | 2015045500 A1 | 4/2015 |
| WO | 2015103483 A1 | 7/2015 |
| WO | 2015126272 A1 | 8/2015 |
| WO | 2015148411 A1 | 10/2015 |
| WO | 2015164903 A1 | 11/2015 |
| WO | 2015193177 A2 | 12/2015 |

(56) References Cited

FOREIGN PATENT DOCUMENTS

| WO | 2015193634 A1 | 12/2015 |
|---|---|---|
| WO | 2016003482 A1 | 1/2016 |
| WO | 2016147918 A1 | 9/2016 |

OTHER PUBLICATIONS

CRC Handbook of Chemistry and Physics, 2015-2016, 96th Ed., "The Elements"—Evidentiary Reference.*

Bismuth Telluride Semiconductors, Evidentiary Reference.*

MIT. "Material Property Database: Polyimide." http://www.mit.edu/~6.777/matprops/polyimide.htm. Accessed online May 9, 2017.*

Oxford Dictionary. "Definition of Sensor." https://en.oxforddictionaries.com/definition/sensor. Accessed online May 10, 2017.*

"A Shoe-Embedded Piezoelectric Energy Harvester for Wearable Sensors", Sensors, Jul. 11, 2014 by Jingling Zhao et al. (pp. 9) http://www.ncbi.nlm.nih.gov/pmc/articles/PMC4168512/.

"Evaluating Energy-Harvesting Technologies for Wearable Designs", Article Library, Contributed by Publitek Marketing Communications, Dec. 3, 2014 by European Editors (pp. 4) http://www.digikey.com/en/articles/techzone/2014/dec/evaluating-energy-harvesting-technologies-for-wearable-designs.

"Energy Harvesting Moves into Wearable Electronics", Article Library, Contributed by Publitek Marketing Communications, Feb. 15, 2012 by European Editors (pp. 5) http://www.digikey.com/en/articles/techzone/2012/feb/energy-harvesting-moves-into-wearable-electronics.

"Top 5 Energy Harvesting Options for Wearable Devices", Avnet, 2016 by James C. Hess (pp. 2) http://www.em.avnet.com/en-us/design/technical-articles/Pages/Articles/Top-5-Energy-Harvesting-Options-for-Wearable-Devices.aspx.

"Miniaturized Thermoelectric Power Sources", 34th Intersociety Energy Conversion Engineering Conference Proc., Vancouver, BC, Canada, 1999 by J. P. Fleurial et al. (pp. 5) http://www.thermoelectrics.caltech.edu/publications/pdf/IECEC-992569-Paper.pdf.

"Energy Harvesting Technology Can Be the Wave of the Future", Wearable Technologies Conference, San Fransisco, Jul. 13, 2015 by by Spela Kosir (pp. 8) https://www.wearable-technologies.com/2015/07/energy-harvesting-technology-can-be-the-wave-of-the-future/.

"Thermoelectric Energy Harvesting 2014-2024: Devices, Applications, Opportunities", IDTechEx by Dr Harry Zervos (pp. 3) http://www.idtechex.com/research/reports/thermoelectric-energy-harvesting-2014-2024-devices-applications-opportunities-000392.asp.

"TEGwear™ Technology", Perpetua—Renewable Energy Solutions for Wireless Sensors, 2015 (p. 1) http://www.perpetuapower.com/technology.htm.

"Thin-film Thermoelectric—Energy Harvesting for Internet of Things", Thermogen, 2016 (pp. 4) http://www.thermogentech.com/#services.

"Thermoelectric Fabrics: Toward Power Generating Clothing", Scientific Reports 5, Article No. 6411, Mar. 23, 2015 by Yong Du et al. (pp. 15) http://www.nature.com/articles/srep06411.

"Energy harvesting for assistive and mobile applications", Energy Science and Engineering, vol. 3, Issue 3, Feb. 17, 2015 by Vikrant Bhatnagar et al. (pp. 14) http://onlinelibrary.wiley.com/doi/10.1002/ese3.63/full "A Shoe-Embedded Piezoelectric Energy Harvester for Wearable Sensors", Sensors, Jul. 11, 2014 by Jingjing Zhao et al. (pp. 9) http://www.ncbi.nlm.nih.gov/pmc/articles/PMC4168512/.

"Energy Harvesting Peltier Ring", HackADay, Feb. 2, 2016 by James Hobson (p. 1) http://hackaday.com/2013/12/02/energy-harvesting-peltier-ring/.

"Flexible Thin-film Thermoelectric Generator Inserting cr Buffer Layer", National Institute of Advanced Industrial Science and Technology, Dec. 2, 2012 by M. Mizoshiri et al. (pp. 4) http://cap.ee.ic.ac.uk/~pdm97/powermems/2012/poster/P-058.pdf.

* cited by examiner

ENERGY HARVESTING FOR WEARABLE TECHNOLOGY THROUGH A THIN FLEXIBLE THERMOELECTRIC DEVICE

FIELD OF TECHNOLOGY

This disclosure relates generally to energy production, more particularly, to energy harvesting for wearable technology through a thin, flexible thermoelectric device.

BACKGROUND

A thermoelectric device is able to directly convert heat (i.e. a temperature gradient) into electricity. If their efficiency may be increased and the operational temperatures reduced to near room temperature (300K), thermoelectric devices may begin to supplement or even supplant traditional power sources used in wearable or internet of things (IoT) devices. High thermal conductivity with lower electrical conductivity may prevent higher efficiency. Unfortunately, there are no single materials that possess simultaneously higher electrical conductivity and lower thermal conductivity. Low efficiency and high operating temperatures, combined with higher cost, prohibit current thermoelectric devices from wider market adoption.

Low efficiency may relegate thermoelectric devices to a few applications where their simplicity and ruggedness may outweigh the inefficiency, such as sensors and waste-heat-energy converters. The current market products are often used in conjunction with either heat sink or active cooling at high temperatures for industrial use cases. Additionally, the current state of the art thermoelectric devices are rigid and bulky, and are produced using complex processes which scale poorly, resulting in higher cost. As a result, current thermoelectric devices, being expensive, inefficient near room temperature, rigid, and bulky, are less than ideal for use in wearable or internet of things (IoT) devices.

SUMMARY

Disclosed are a method and apparatus of energy harvesting for wearable technology through a thin flexible thermoelectric device. It will be appreciated that the various embodiments discussed herein need not necessarily belong to the same group of exemplary embodiments, and may be grouped into various other embodiments not explicitly disclosed herein. In the following description, for purposes of explanation, numerous specific details are set forth in order to provide a thorough understanding of the various embodiments. Accordingly, the specification and drawings are to be regarded in an illustrative rather than a restrictive sense.

In one aspect, a flexible thermoelectric device includes a lower dielectric layer and a lower conduction layer, where the lower conduction layer includes an electrically conductive pad. The device further includes an active layer, comprising a thin film thermoelectric conduit, wherein the thin film thermoelectric conduit is vacuum deposited on top of each electrically conductive pad using a mask. The device also includes an upper conduction layer, comprising an electrically conductive contact coupled to the top of each of the thin film thermoelectric conduits. Each of the thin film thermoelectric conduits includes a thermoelectric material, and the active layer further includes a thermal insulator filling a space around each of the thin film thermoelectric conduits.

The lower conduction layer and the upper conduction layer may further include an electrically conductive lead to bridge pairs of electrically conductive pads and to bridge pairs of electrically conductive contacts. The electrically conductive pads may be bridged and the electrically conductive contacts may be bridged such that all of the thin film thermoelectric conduits are connected in series. The electrically conductive pads may include an N-designated conductive pad and a P-designated conductive pads. The thin film thermoelectric conduit deposited on each N-designated conductive pad may be vacuum deposited through an N-designated mask and may include an N-type thermoelectric material. Furthermore, the thin film thermoelectric conduit deposited on each P-designated conductive pad may be vacuum deposited through a P-designated mask and may include a P-type thermoelectric material.

The flexible thermoelectric device may further include an internal dielectric layer on top of the active layer and an upper dielectric layer on top of the upper conduction layer. Each of the electrically conductive contacts may run through a contact hole drilled above each of the thin film thermoelectric conduits. Also, each contact hole may pass through the thermal insulator and/or the internal dielectric layer. A portion of the upper conduction layer may be between the internal dielectric layer and the upper dielectric layer. Additionally, the internal dielectric layer may be an electrical insulator and/or a poor thermal conductor. Finally, the upper dielectric layer and the lower dielectric layer may both be electrical insulators and/or good thermal conductors. The thin film thermoelectric conduit may include a thermoelectric material vacuum deposited no thicker than 50 microns.

The flexible thermoelectric device may include a barrier layer between different thermoelectric materials within a thin film thermoelectric conduit, an electrically conductive pad and a thin film thermoelectric conduit, and/or an electrically conductive contact and a thin film thermoelectric conduit. The barrier layer may be electrically conductive and may have a higher melting temperature than either of the substances being separated by the barrier layer.

The electrically conductive pads may include a metal cladding, a vacuum deposited metal, a conductive paste, an electroplated layer, and/or a surface plating layer. Furthermore, the electrically conductive contacts may include a conductive paste, an electroplated layer, and/or a surface plating layer. Finally, the thin film thermoelectric conduit and/or the lower conduction layer may be annealed before the upper conduction layer is applied.

In another aspect, a method of producing a flexible thermoelectric device includes creating a lower conduction layer including a plurality of electrically conductive pads and a electrically conductive lead on a lower dielectric layer. The plurality of electrically conductive pads include N-designated conductive pads and P-designated conductive pads. The method also includes aligning an N-designated mask with the lower conduction layer such that the N-designated conductive pads are exposed through the N-designated mask, and vacuum depositing an N-type conduit on top of each of the N-designated conductive pads exposed through the N-designated mask. The method further includes aligning a P-designated mask with the lower conduction layer such that the P-designated conductive pads are exposed through the P-designated mask, and vacuum depositing a P-type conduit on top of each of the P-designated conductive pads exposed through the P-designated mask.

The method of producing a flexible thermoelectric device includes laminating a thermal insulator and an internal dielectric layer on top of the N-type conduits and P-type conduits, such that the thermal insulator fills a space around each N-type conduit and P-type conduit. The method also includes drilling a contact hole through the internal dielectric layer and thermal insulator above each N-type conduit and each P-type conduit. The method further includes creating an upper conduction layer, including an electrically conductive contact coupled to the top of each N-type conduit and P-type conduit, and an electrically conductive lead. The electrically conductive contacts run through the contact holes. Finally, the method includes affixing an upper dielectric layer on top of the upper conduction layer.

A portion of the upper conduction layer is between the internal dielectric layer and the upper dielectric layer. The N-type conduits are thin film thermoelectric conduits including at least one N-type thermoelectric material. Furthermore, the P-type conduits are thin film thermoelectric conduits including at least one P-type thermoelectric material. Finally, pairs of electrically conductive pads are bridged with electrically conductive leads and pairs of electrically conductive contacts are bridged with electrically conductive leads such that all of the thin film thermoelectric conduits are connected in series.

The internal dielectric layer may be an electrical insulator and/or a poor thermal conductor. The upper dielectric layer and the lower dielectric layer may both be electrical insulators and/or good thermal conductors. Also, the thin film thermoelectric conduits may include a thermoelectric material vacuum deposited no thicker than 50 microns.

The method of producing a flexible thermoelectric device may further include vacuum depositing a barrier layer through the N-designated mask and/or the P-designated mask such that the barrier layer is between different thermoelectric materials within a thin film thermoelectric conduit, an electrically conductive pad and a thin film thermoelectric conduit, and/or an electrically conductive contact and a thin film thermoelectric conduit. The barrier layer may be electrically conductive and/or has a higher melting temperature than either of the substances being separated by the barrier layer.

The method may include applying a resist to the lower dielectric layer using a lower conduction mask. The lower dielectric layer may be metal-clad, and the lower conduction layer may be created by etching the lower dielectric layer to remove exposed metal-cladding and/or removing the resist. The lower conduction layer, the N-type conduits and the P-type conduit may be annealed before the upper conduction layer is applied. Finally, the aligning of the N-designated mask, the vacuum depositing of the N-type conduit, the aligning of the P-designated mask, and/or the vacuum depositing of the P-type conduit, may all be accomplished within the same vacuum system while continuing to maintain a vacuum.

In yet another aspect, a flexible thermoelectric device includes a lower dielectric layer and a lower conduction layer, which includes an electrically conductive pad on the lower dielectric layer. The device also includes an active layer, including a thin film thermoelectric conduit. The thin film thermoelectric conduit is affixed on top of each electrically conductive pad. The device further includes an internal dielectric layer on top of the active layer, and an upper conduction layer, including an electrically conductive contact coupled to the top of each of the thin film thermoelectric conduits.

Finally, the device includes an upper dielectric layer on top of the upper conduction layer. Each of the thin film thermoelectric conduits includes a thermoelectric material. The active layer further includes a thermal insulator filling at least the space around each of the thin film thermoelectric conduits. Also, the lower conduction layer and the upper conduction layer further include at least one electrically conductive lead to bridge pairs of electrically conductive pads and to bridge pairs of electrically conductive contacts. The electrically conductive pads are bridged and the electrically conductive contacts are bridged such that all of the thin film thermoelectric conduits are connected in series.

The electrically conductive pads include an N-designated conductive pad and a P-designated conductive pad. Additionally, the thin film thermoelectric conduit affixed to each N-designated conductive pad includes an N-type thermoelectric material, and the thin film thermoelectric conduit affixed to each P-designated conductive pad includes a P-type thermoelectric material. Also, each of the electrically conductive contacts runs through a contact hole drilled above each of the thin film thermoelectric conduits. Each contact hole passes through the thermal insulator and the internal dielectric layer. Finally, a portion of the upper conduction layer is between the internal dielectric layer and the upper dielectric layer. The internal dielectric layer is an electrical insulator and a poor thermal conductor, while the upper dielectric layer and the lower dielectric layer are both electrical insulators and good thermal conductors.

The flexible thermoelectric device may also include a thermal adhesive layer affixed to the upper dielectric layer and/or the lower dielectric layer, to adhere the flexible thermoelectric device to a target platform. The thermal adhesive layer may have a coefficient of thermal expansion compatible with the target platform, such that adhesion may not be compromised due to thermal expansion while the target platform is within an intended temperature range. The target platform may be a wearable device, a clothing, a jewelry, a sensor, a handheld device, and/or a building material.

The methods and apparatus disclosed herein may be implemented in any means for achieving various aspects. Other features will be apparent from the accompanying drawings and from the detailed description that follows.

BRIEF DESCRIPTION OF THE DRAWINGS

The embodiments of this invention are illustrated by way of example and not limitation in the Figures of the accompanying drawings, in which like references indicate similar elements and in which.

Figure 1:
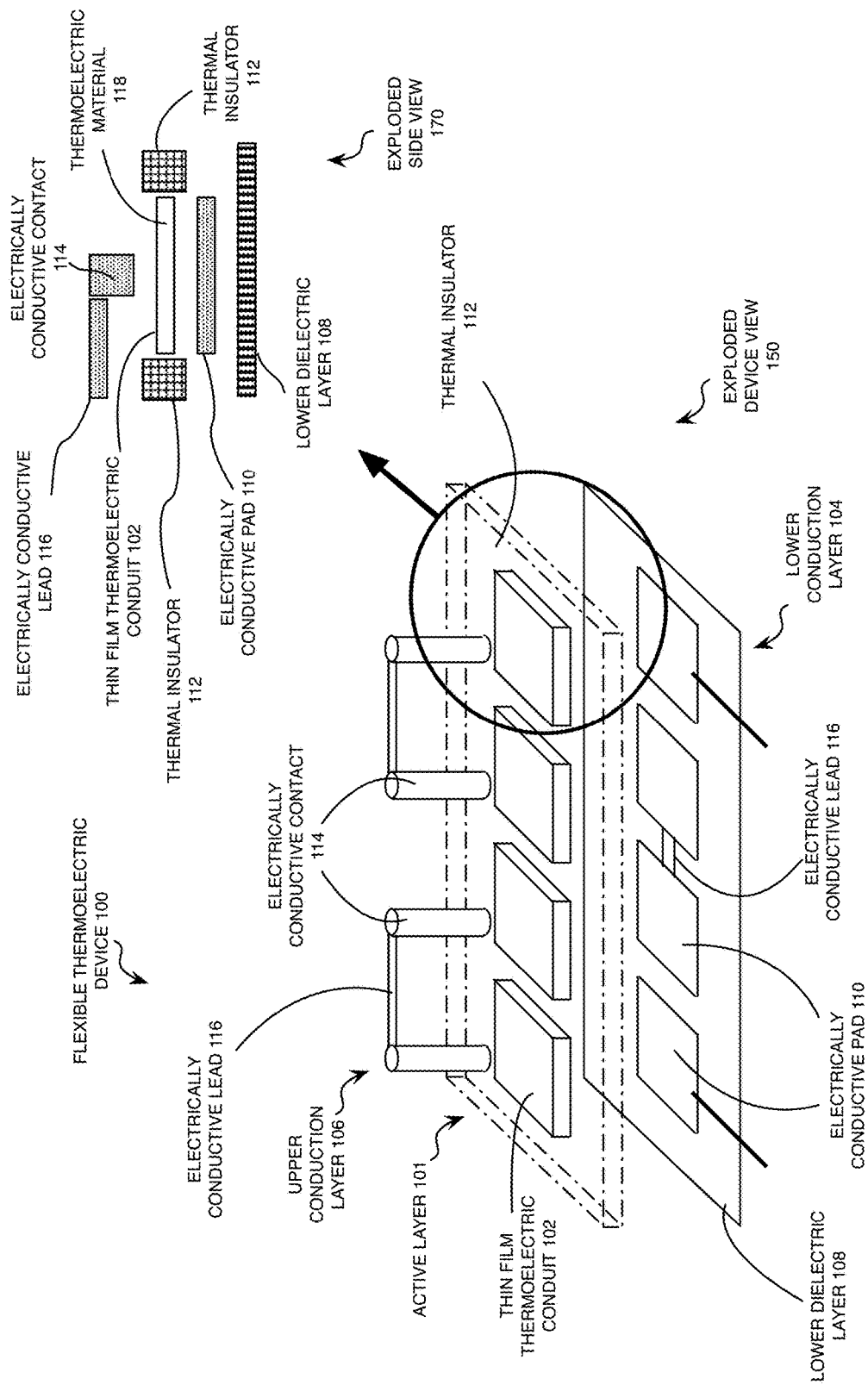
FIG. 1 shows an exploded device view of a flexible thermoelectric device comprising at least one thin film thermoelectric conduit between a lower conduction layer and an upper conduction layer, according to one embodiment.

Other features of the present embodiments will be apparent from the accompanying drawings and from the detailed description that follows.

DETAILED DESCRIPTION

Example embodiments, as described below, may be used to provide a method and/or an apparatus of voltage generation across temperature differentials through a thin film thermoelectric device. Although the present embodiments have been described with reference to specific example embodiments, it will be evident that various modifications and changes may be made to these embodiments without departing from the broader spirit and scope of the various embodiments.

In one embodiment, a flexible thermoelectric device 100 includes a lower dielectric layer 108 and a lower conduction layer 104, where the lower conduction layer 104 includes an electrically conductive pad 110. The device further includes an active layer 101, comprising a thin film thermoelectric conduit 102, wherein the thin film thermoelectric conduit 102 is vacuum deposited on top of each electrically conductive pad 110 using a mask. The device also includes an upper conduction layer 106, comprising an electrically conductive contact 114 coupled to the top of each of the thin film thermoelectric conduits 102. Each of the thin film thermoelectric conduits 102 includes a thermoelectric material 118, and the active layer 101 further includes a thermal insulator 112 filling a space around each of the thin film thermoelectric conduits 102.

The lower conduction layer 104 and the upper conduction layer 106 may further include an electrically conductive lead 116 to bridge pairs of electrically conductive pads 110 and to bridge pairs of electrically conductive contacts 114. The electrically conductive pads 110 may be bridged and the electrically conductive contacts 114 may be bridged such that all of the thin film thermoelectric conduits 102 are connected in series. The electrically conductive pads 110 may include an N-designated conductive pad 206 and a P-designated conductive pad 208. The thin film thermoelectric conduit 102 deposited on each N-designated conductive pad 206 may be vacuum deposited through an N-designated mask 302 and may include an N-type thermoelectric material 210. Furthermore, the thin film thermoelectric conduit 102 deposited on each P-designated conductive pad 208 may be vacuum deposited through a P-designated mask 304 and may include a P-type thermoelectric material 212.

The flexible thermoelectric device 100 may further include an internal dielectric layer 203 on top of the active layer 101 and an upper dielectric layer 204 on top of the upper conduction layer 106. Each of the electrically conductive contacts 114 may run through a contact hole 220 drilled above each of the thin film thermoelectric conduits 102. Also, each contact hole 220 may pass through the thermal insulator 112 and/or the internal dielectric layer 203. A portion of the upper conduction layer 106 may be between the internal dielectric layer 203 and the upper dielectric layer 204. Additionally, the internal dielectric layer 203 may be an electrical insulator and/or a poor thermal conductor. Finally, the upper dielectric layer 204 and the lower dielectric layer 108 may both be electrical insulators and/or good thermal conductors. The thin film thermoelectric conduit 102 may include a thermoelectric material 118 vacuum deposited no thicker than 50 microns.

The flexible thermoelectric device 100 may include a barrier layer 218 between different thermoelectric materials within a thin film thermoelectric conduit 102, an electrically conductive pad 110 and a thin film thermoelectric conduit 102, and/or an electrically conductive contact 114 and a thin film thermoelectric conduit 102. The barrier layer 218 may be electrically conductive and may have a higher melting temperature than either of the substances being separated by the barrier layer 218.

Figure 2:
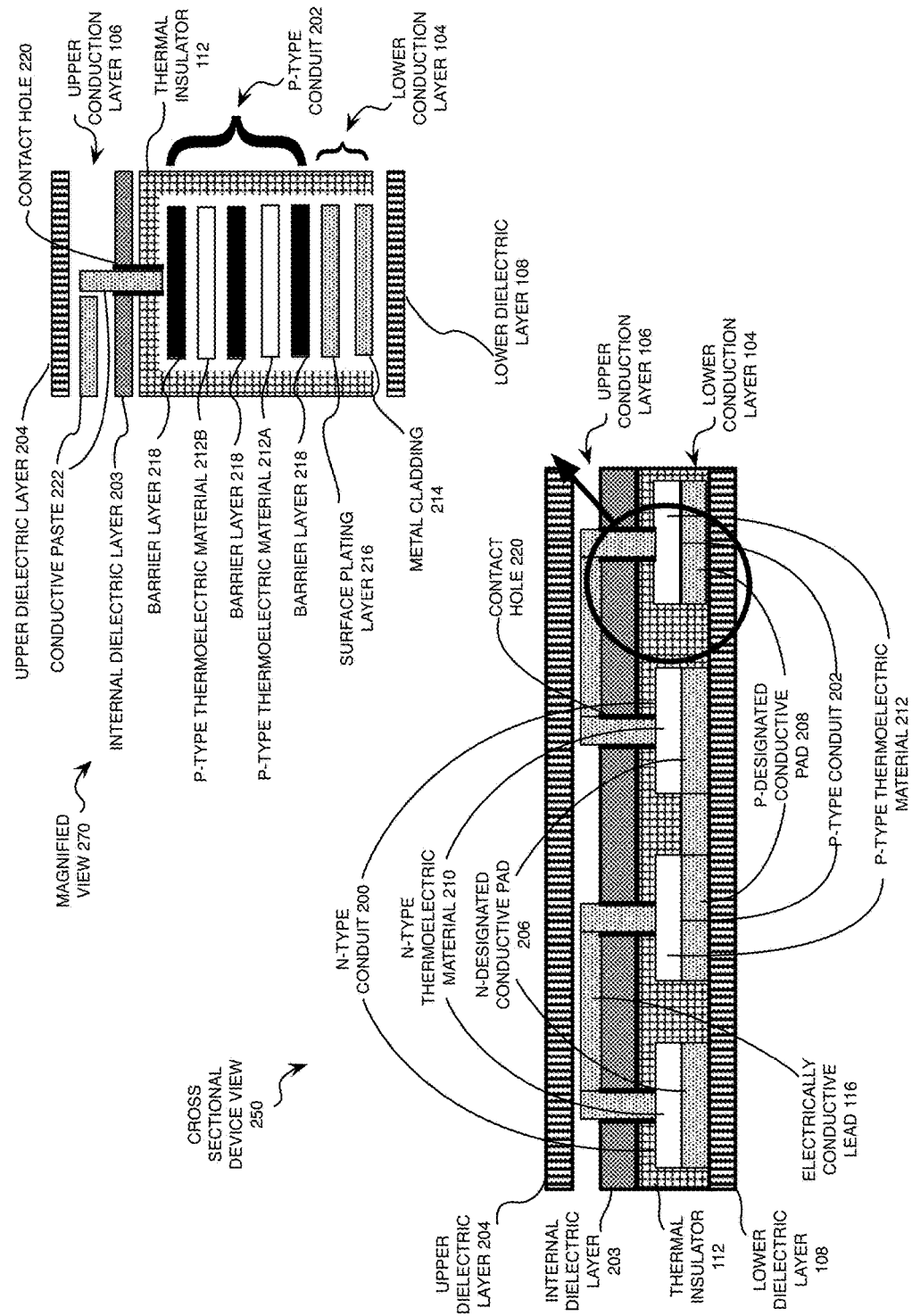
FIG. 2 shows a cross sectional device view of the flexible thermoelectric device of FIG. 1, comprising N-type conduits and P-type conduits, and a magnified view of a P-type conduit and its environment, according to one embodiment.

The electrically conductive pads 110 may include a metal cladding (e.g. the metal cladding 214 of FIG. 2, etc.), a vacuum deposited metal, a conductive paste (e.g. the conductive paste 222 of FIG. 2, etc.), an electroplated layer, and/or a surface plating layer (e.g. the surface plating layer 216 of FIG. 2, etc.). Furthermore, the electrically conductive contacts 114 may include a conductive paste (e.g. the conductive paste 222 of FIG. 2, etc.), an electroplated layer, and/or a surface plating layer (e.g. the surface plating layer 216 of FIG. 2, etc.). Finally, the thin film thermoelectric conduit 102 and/or the lower conduction layer 104 may be annealed before the upper conduction layer 106 is applied.

In another embodiment, a method of producing a flexible thermoelectric device 100 includes creating a lower conduction layer 104 including a plurality of electrically conductive pads 110 and an electrically conductive lead 116 on a lower dielectric layer 108. The plurality of electrically conductive pads 110 include N-designated conductive pads 206 and P-designated conductive pads 208. The method also includes aligning an N-designated mask 302 with the lower conduction layer 104 such that the N-designated conductive pads 206 are exposed through the N-designated mask 302, and vacuum depositing an N-type conduit 200 on top of each of the N-designated conductive pads 206 exposed through the N-designated mask 302. The method further includes aligning a P-designated mask 304 with the lower conduction layer 104 such that the P-designated conductive pads 208 are exposed through the P-designated mask 304, and vacuum depositing a P-type conduit 202 on top of each of the P-designated conductive pads 208 exposed through the P-designated mask 304.

The method of producing a flexible thermoelectric device 100 includes laminating a thermal insulator 112 and an internal dielectric layer 203 on top of the N-type conduits 200 and P-type conduits 202, such that the thermal insulator 112 fills a space around each N-type conduit 200 and P-type conduit 202. The method also includes drilling a contact hole 220 through the internal dielectric layer 203 and thermal insulator 112 above each N-type conduit 200 and each P-type conduit 202. The method further includes creating an upper conduction layer 106, including an electrically conductive contact 114 coupled to the top of each N-type conduit 200 and P-type conduit 202, and an electrically conductive lead 116. The electrically conductive contacts 114 run through the contact holes 220. Finally, the method includes affixing an upper dielectric layer 204 on top of the upper conduction layer 106.

A portion of the upper conduction layer 106 is between the internal dielectric layer 203 and the upper dielectric layer 204. The N-type conduits 200 are thin film thermoelectric conduits 102 including at least one N-type thermoelectric material 210. Furthermore, the P-type conduits 202 are thin film thermoelectric conduits 102 including at least one P-type thermoelectric material 212. Finally, pairs of electrically conductive pads 110 are bridged with electrically conductive leads 116 and pairs of electrically conductive contacts 114 are bridged with electrically conductive leads 116 such that all of the thin film thermoelectric conduits 102 are connected in series.

The internal dielectric layer 203 may be an electrical insulator and/or a poor thermal conductor. The upper dielectric layer 204 and the lower dielectric layer 108 may both be electrical insulators and/or good thermal conductors. Also, the thin film thermoelectric conduits 102 may include a thermoelectric material 118 vacuum deposited no thicker than 50 microns.

The method of producing a flexible thermoelectric device 100 may further include vacuum depositing a barrier layer 218 through the N-designated mask 302 and/or the P-designated mask 304 such that the barrier layer 218 is between different thermoelectric materials within a thin film thermoelectric conduit 102, an electrically conductive pad 110 and a thin film thermoelectric conduit 102, and/or an electrically conductive contact 114 and a thin film thermoelectric conduit 102. The barrier layer 218 may be electrically conductive and/or has a higher melting temperature than either of the substances being separated by the barrier layer 218.

The method may include applying a resist 604 to the lower dielectric layer 108 using a lower conduction mask 300. The lower dielectric layer 108 may be metal-clad, and the lower conduction layer 104 may be created by etching the lower dielectric layer 108 to remove exposed metal-cladding and/or removing the resist 604. The lower conduction layer 104, the N-type conduits 200 and the P-type conduit 202 may be annealed before the upper conduction layer 106 is applied. Finally, the aligning of the N-designated mask 302, the vacuum depositing of the N-type conduit 200, the aligning of the P-designated mask 304, and/or the vacuum depositing of the P-type conduit 202, may all be accomplished within the same vacuum system 612 while continuing to maintain a vacuum 614.

In yet another embodiment, a flexible thermoelectric device 100 includes a lower dielectric layer 108 and a lower conduction layer 104, which includes an electrically conductive pad 110 on the lower dielectric layer 108. The device also includes an active layer 101, including a thin film thermoelectric conduit 102. The thin film thermoelectric conduit 102 is affixed on top of each electrically conductive pad 110. The device further includes an internal dielectric layer 203 on top of the active layer 101, and an upper conduction layer 106, including an electrically conductive contact 114 coupled to the top of each of the thin film thermoelectric conduits 102.

Finally, the device includes an upper dielectric layer 204 on top of the upper conduction layer 106. Each of the thin film thermoelectric conduits 102 includes a thermoelectric material 118. The active layer 101 further includes a thermal insulator 112 filling at least the space around each of the thin film thermoelectric conduits 102. Also, the lower conduction layer 104 and the upper conduction layer 106 further include at least one electrically conductive lead 116 to bridge pairs of electrically conductive pads 110 and to bridge pairs of electrically conductive contacts 114. The electrically conductive pads 110 are bridged and the electrically conductive contacts 114 are bridged such that all of the thin film thermoelectric conduits 102 are connected in series.

The electrically conductive pads 110 include an N-designated conductive pad 206 and a P-designated conductive pad 208. Additionally, the thin film thermoelectric conduit 102 affixed to each N-designated conductive pad 206 includes an N-type thermoelectric material 210, and the thin film thermoelectric conduit 102 affixed to each P-designated conductive pad 208 includes a P-type thermoelectric material 212. Also, each of the electrically conductive contacts 114 runs through a contact hole 220 drilled above each of the thin film thermoelectric conduits 102. Each contact hole 220 passes through the thermal insulator 112 and the internal dielectric layer 203. Finally, a portion of the upper conduction layer 106 is between the internal dielectric layer 203 and the upper dielectric layer 204. The internal dielectric layer 203 is an electrical insulator and a poor thermal conductor, while the upper dielectric layer 204 and the lower dielectric layer 108 are both electrical insulators and good thermal conductors.

The flexible thermoelectric device 100 may also include a thermal adhesive layer affixed to the upper dielectric layer 204 and/or the lower dielectric layer 108, to adhere the flexible thermoelectric device 100 to a target platform 700. The thermal adhesive layer may have a coefficient of thermal expansion compatible with the target platform 700, such that adhesion may not be compromised due to thermal expansion while the target platform 700 is within an intended temperature range. The target platform 700 may be a wearable device, a clothing, a jewelry, a sensor, a handheld device, and/or a building material.

FIG. 1 shows an exploded device view 150 of a flexible thermoelectric device 100 comprising at least one thin film thermoelectric conduit 102 between a lower conduction layer 104 and an upper conduction layer 106, according to one embodiment. Specifically, FIG. 1 shows a flexible thermoelectric device 100, an active layer 101, a thin film thermoelectric conduit 102, a lower conduction layer 104, an upper conduction layer 106, a lower dielectric layer 108, a electrically conductive pad 110, a thermal insulator 112, an electrically conductive contact 114, an electrically conductive lead 116, and a thermoelectric material 118.

The flexible thermoelectric device 100 may be a flexible device which converts heat (i.e. a temperature differential) directly into electrical energy. Furthermore, applying a current to a thermoelectric device may create a temperature differential, which may be used to heat or cool a surface.

The active layer 101 may be a portion of the flexible thermoelectric device 100 which comprises thermoelectric materials. In some embodiments, the active layer 101 may further comprise materials and/or components which are not thermoelectric or electrically conductive.

The thin film thermoelectric conduit 102 may be a layer of thermoelectric material 118 or a stack of layered materials which comprises thermoelectric materials 118. In one embodiment, some or all of these layers may be applied or deposited as a thin film, whose thickness may range from sub-nanometer to micrometers. The lower conduction layer 104 and the upper conduction layer 106 may be layers within the flexible thermoelectric device 100 which are comprised of electrically conductive material electrically coupled to thin film thermoelectric conduits 102. In various embodiments, the thin film thermoelectric conduit 102 may be incorporated into the flexible thermoelectric device 100 in such a way that it serves as a conduit for heat from one side of the device to the other.

The lower dielectric layer 108 may be a flexible dielectric material which provides structure to the flexible thermoelectric device 100. In various embodiments, the lower dielectric layer 108 may be a flexible polymer material which has a high thermal conductivity, and is also electrically insulating. Examples include, but are not limited to, polyimide which has been doped to increase thermal conductivity. In some embodiments, the lower dielectric layer 108 may be between 1 millimeter and 10 millimeters thick. The lower dielectric layer 108 may also be metal-clad, such as copper-clad Kapton tape. The lower dielectric layer 108 should be chosen such that it will not melt at the temperatures associated with the production of the flexible thermoelectric device 100 (e.g. the high temperatures associated with sputter deposition, etc.).

An electrically conductive pad 110 may be a flat area which may be affixed to a material or component, or to which a material or component may be affixed to make an electrical connection. A thermal insulator 112 may be a material which reduces the conduction of thermal energy. In the context of the present description, the thermal insulator 112 may also be electrically insulating. The thermal insulator 112 may be a cross-linked polymer adhesive, such as prepeg or other resins with similar properties.

An electrically conductive contact 114 may be a conductive element in electrical contact with a material or component. In some embodiments, the electrically conductive contact 114 may resemble a pin. In other embodiments, the electrically conductive contact 114 may be flat, like an electrically conductive pad 110.

An electrically conductive lead 116 may a conducting material which connect two points of a circuit together. In one embodiment, the electrically conductive lead 116 may be a conducting material applied directly to a surface (e.g. etched cladding, vacuum deposition, surface plating, electroplating, etc.). In another embodiment, the electrically conductive lead 116 may be a wire.

A thermoelectric material 118 may be a material which converts a temperature gradient directly into electrical energy, and visa versa. Example thermoelectric materials 118 include, but are not limited to, $Bi_2Te_3$, ZnSb, PbTe, $Zn_4Sb_3$, $AgPb_{18}SbTe_{20}$ filled skutterudites, $Bi_2Te_3/Sb_2Te_3$ Superlattices, PbSeTe/PbTe quantum dots, $Si_{1-x}Ge_x$, $CsBi_4Te_6$, $AgPbmSbTe_{2+m}$, $Yb_{0.19}Co_4Sb_{12}$, and $CeFe_{4-x}CoxSb_{12}$.

A thermoelectric device, e.g. the flexible thermoelectric device 100 of FIG. 1, produces electrical power from heat flow across a temperature gradient. As the heat flows from hot to cold, free charge carriers (electrons and/or holes) in the material are also driven to the cold end. The resulting voltage (V) is proportional to the temperature difference ($\Delta T$) via the Seebeck coefficient, $\alpha$, ($V=\alpha\Delta T$). By connecting an electron-conducting (N-type) and hole-conducting (P-type) material in series, a net voltage may be produced that can be driven through a load. A good thermoelectric material 118 has a Seebeck coefficient close to 300 µV/K; thus, in order to achieve a few volts at the load, many thermoelectric couples may need to be connected in series to make the thermoelectric device.

Thermoelectric power generation may be a means of generating power by converting thermal energy into electric energy. The efficiency ($\eta$) of converting thermal energy into electric energy of the thermoelectric conversion material depends on the ZT value (ZT) of the thermoelectric conversion material. The thermoelectric device may be a heat engine and hence limited by Carnot efficiency $\{\eta c=(TH-TC)/TH\}$. The ZT value (ZT) is determined by the equation, $ZT=(\alpha^2\sigma T/K)$, according to the Seebeck coefficient $\alpha$, also referred to as "thermoelectric coefficient", electric conductivity ($\sigma$), thermal conductivity (K) of the thermoelectric material, and absolute temperature (T).

The flexible thermoelectric device 100 may reduce thermal conductivity while facilitating use in a number of applications. As shown in FIG. 1, a thin film thermoelectric conduit 102 comprising a thermoelectric material 118 (e.g. Bismuth Telluride $Bi_2Te_3$) may be directly deposited on a lower conduction layer 104 (i.e. the one or more electrically conductive pads 110). As shown in FIG. 2, additional layers of thermoelectric material 118 and barrier materials may also be deposited. The patterning and creation of these layers may be done using processes that are scalable, and may be adjusted for particular applications quickly.

As shown in exploded device view 150 of FIG. 1, the thin film thermoelectric conduits 102 of the active layer 101 are electrically coupled to the lower conduction layer 104 and the upper conduction layer 106. As a whole, this coupling results in all of the thin film thermoelectric conduits 102 being electrically connected in series. Furthermore, exploded device view 150 and exploded side view 170 of FIG. 1 show that the thermal insulator 112 of the active layer 101 fills at least the space around the thin film thermoelectric conduits 102, according to one embodiment. This is done so the transfer of thermal energy associated with a temperature gradient between two sides of the flexible thermoelectric device 100 is directed through the thin film thermoelectric conduits 102.

FIG. 2 shows a cross sectional device view of the flexible thermoelectric device 100 of FIG. 1, comprising N-type conduits 200 and P-type conduits 202, and a magnified view of a P-type conduit 202 and its environment, according to one embodiment. Specifically, FIG. 2 shows a N-type conduit 200, a P-type conduit 202, an internal dielectric layer 203, an upper dielectric layer 204, a N-designated conductive pad 206, a P-designated conductive pad 208, a N-type thermoelectric material 210, a P-type thermoelectric material 212, a metal cladding 214, a surface plating layer 216, a barrier layer 218, a contact hole 220, and a conductive paste 222, in addition to the lower dielectric layer 108, the lower conduction layer 104, the upper conduction layer 106, the thermal insulator 112, and the electrically conductive lead 116 of FIG. 1.

A N-type conduit 200 may be a layer or a stack of layered materials within the flexible thermoelectric device 100 which is comprised, at least in part, of one or more thermoelectric materials 118 in which the primary charge carrier is electrons. According to various embodiments, an N-type conduit 200 may comprise thin film N-type thermoelectric materials 210, conductive materials, barrier layers 218, and/or conductive adhesive layers 400.

A P-type conduit 202 may be a layer or a stack of layered materials within the flexible thermoelectric device 100 which is comprised, at least in part, of one or more thermoelectric materials 118 in which the primary charge carrier is positive holes. According to various embodiments, a P-type conduit 202 may comprise thin film P-type thermoelectric materials 212, conductive materials, barrier layers 218, and/or conductive adhesive layers 400.

An internal dielectric layer 203 may be a flexible dielectric material which has poor thermal conductivity and is also electrically insulating. Examples include, but are not limited to, Teflon. An upper dielectric layer 204 may be a flexible dielectric material which provides structure to the flexible thermoelectric device 100. In various embodiments, the upper dielectric layer 204 may have a high thermal conductivity, and is also electrically insulating. In some embodiments, the upper dielectric layer 204 may be identical to the lower dielectric layer 108.

A N-designated conductive pad 206 may be a conductive pad which is intended to connect an N-type conduit 200 in series with other thermoelectric layers. Similarly, a P-designated conductive pad 208 may be a conductive pad which is intended to connect a P-type conduit 202 in series with other thermoelectric layers. In some embodiments, these two types of pads may possess identical materials and properties, and may differ only in appearance, to aid in device construction and testing. For example, in one embodiment, the N-designated and P-designated conductive pads may simply be given different shapes to indicate the material type.

In other embodiments, however, these two pad types may differ in more substantial ways. For example, in one embodiment, the N-designated and P-designated conductive pads may be composed of different conductive materials which are optimized for the N-type and P-type conduits to be deposited upon them (e.g. have a similar crystal structure, etc.). In such an embodiment, the N-designated and P-designated conductive pads 208 may be created using N-designated and P-designated masks, and may be affixed to interconnected conductive pads.

A N-type thermoelectric material 210 may be a thermoelectric material 118 in which the primary charge carrier is electrons. A P-type thermoelectric material 212 may be a thermoelectric material 118 in which the primary charge carrier is positive holes. A metal cladding 214 may be a metallic electroplating applied to a polymer sheet. Examples include, but are not limited to, copper-clad Kapton tape. In some embodiments, the metal cladding 214 may be removed from the polymer sheet using resist 604 and an etchant 608.

A surface plating layer 216 may be a conductive layer applied to a solid material using a chemical technique. Examples include, but are not limited to, electroless nickel immersion gold (i.e. ENIG), and solder (i.e. HASL, or hot air solder leveling).

A barrier layer 218 may be a layer of material which prevents the corruption (e.g. diffusion, sublimation, etc.) of one layer by another, according to one embodiment. It may also be known as a diffusion barrier. In many embodiments, a diffusion barrier may be a thin layer (e.g. micrometers thick) of metal sometimes placed between two other metals. It is done to act as a barrier to protect either one of the metals from corrupting the other. Example barrier layer 218 materials include, but are not limited to, cobalt, nickel, tungsten, ruthenium, tantalum, tantalum nitride, indium oxide, tungsten nitride, and titanium nitride.

In some embodiments, the barrier layer 218 may consist of material with very low thermal conductivity and very high electrical conductivity. Inclusion of a barrier layer 218 of this nature may serve to improve the thermoelectric performance by reducing thermal conductivity, which in turn preserves a larger temperature differential, without sacrificing electrical conductivity. In some embodiments, a barrier layer 218 may serve as both a diffusion barrier and a thermal barrier. Example barrier layer materials with these properties include, but are not limited to, Indium Antimonide (InSb) and other skutterides, which have low thermal conductivity and high electrical conductivity.

The contact hole 220 may be a passage created through material which separates the electrically conductive leads 116 of the upper conduction layer 106 and the thin film thermoelectric conduits 102 of the active layer 101. Specifically, the contact hole 220 may be a passage through the thermal insulator 112 and/or internal dielectric layer 203 which is on top of a thin film thermoelectric conduit 102. In various embodiments, the contact hole 220 may be formed by drilling through the material above a thin film thermoelectric conduit 102, either mechanically or using a laser.

A conductive paste 222 may be a powdered metal compound suspended in a viscous medium. Examples include, but are not limited to, silver or other conductive ink, silver paste, and solder paste. In various embodiments, a conductive paste 222 may be applied using a screen printing process, where the paste is applied using a mask or stencil.

A vacuum deposited metal may be a metal layer deposited using a vacuum deposition process. A vacuum deposition process may be a process in which layers of material are deposited on a solid surface atom-by-atom or molecule-by-molecule, at a pressure well below atmospheric pressure. One example of a vacuum deposition process is sputtering, or sputter deposition, where atoms are ejected from a solid target material due to the bombardment of the target by energetic particles, such as electrons or highly charged ions. Sputter deposition is a physical vapor deposition method for creating thin films. Other examples of vacuum deposition processes include, but are not limited to, laser ablation, chemical vapor deposition, an cathode arc vaporization.

An electroplated layer may be a conduction layer which is created in a process that uses an electric current to reduce dissolved metal cations to form a metal coating on an electrode. This process is known as electroplating, or electrodeposition. An intended temperature range may be a range of temperatures within which it is foreseeable that a device may be operated. A coefficient of thermal expansion describes how the size of an object changes with a change in temperature.

A screen printed layer may be a conduction layer which is created by depositing a viscous conductive material over a mask or stencil (e.g. the lower conduction mask 300 of FIG. 3, etc.) to create a desired pattern. Examples of viscous conductive materials which may be used in a screen printing process include, but are not limited to, silver filled epoxy or ink, solder paste, and/or silver paste. According to various embodiments, after the conductive material is applied through the mask, the mask is removed and the deposited conduction layer is cured at an appropriate heat (e.g. 100-150 degrees Celsius, etc.).

As shown, the N-type conduits 200 and the P-type conduits 202 are electrically connected to the electrically conductive pads 110 and electrically conductive contacts 114 which make up the upper conduction layer 106 and the lower conduction layer 104. These pads and contacts are in turn connected through electrically conductive leads 116, resulting in the thin film thermoelectric conduits 102 (e.g. N-type conduits 200, P-type conduits 202, etc.) being connected to each other in series.

The flexible thermoelectric device 100 shown in cross sectional device view 250 of FIG. 2 illustrates how the upper conduction layer 106 may be separated from the active layer 101 by a internal dielectric layer 203, at least in part. Specifically, the upper conduction layer 106 is coupled with the thin film thermoelectric conduits 102 of the active layer 101 through electrically conductive contacts 114. These contacts pass through the internal dielectric layer 203 and thermal insulator 112 which separate the electrically conductive leads 116 of the upper conduction layer 106 from the active layer 101 by running through contact holes 220 which have been created above each conduit.

Magnified view 270 offers a closer look at an exemplary portion of a flexible thermoelectric device 100, according to one embodiment. As shown, the lower conduction layer 104 comprises a lower dielectric layer 108 with metal cladding 214. The metal cladding 214 has been selectively removed using etching, and was then covered with a surface plating layer 216, which may be used for superior electrical conductivity, or possibly because it is more amenable to bonding with the subsequent layer.

As shown in magnified view 270, a number of barrier layers 218 are employed in this example of a flexible thermoelectric device 100. Specifically, there is a barrier layer 218 between the surface plating of the lower conduction layer 104 and the first P-type thermoelectric material 212 (e.g. P-type thermoelectric material 212A). This may prevent the elements and compounds within the surface plating layer 216 from leaching into the thermoelectric material 118, possibly altering its properties. Additional barrier layers 218 are used to separate two different thermoelectric materials 118, as well as the second thermoelectric material 118 and the upper conduction layer 106, here comprising screen printed conductive paste 222. In various embodiments, a barrier layer 218 may be used to prevent the leaching or sublimation of neighboring layers or materials.

FIG. 2 also illustrates how the electrically conductive contacts 114 of the upper conduction layer 106 are coupled with the thin film thermoelectric conduits 102 by running through contact holes 220 which have been drilled through the internal dielectric layer 203 and the thermal insulation directly above each conduit. In one embodiment, the contact holes 220 may be created using a laser drill.

Figure 3:
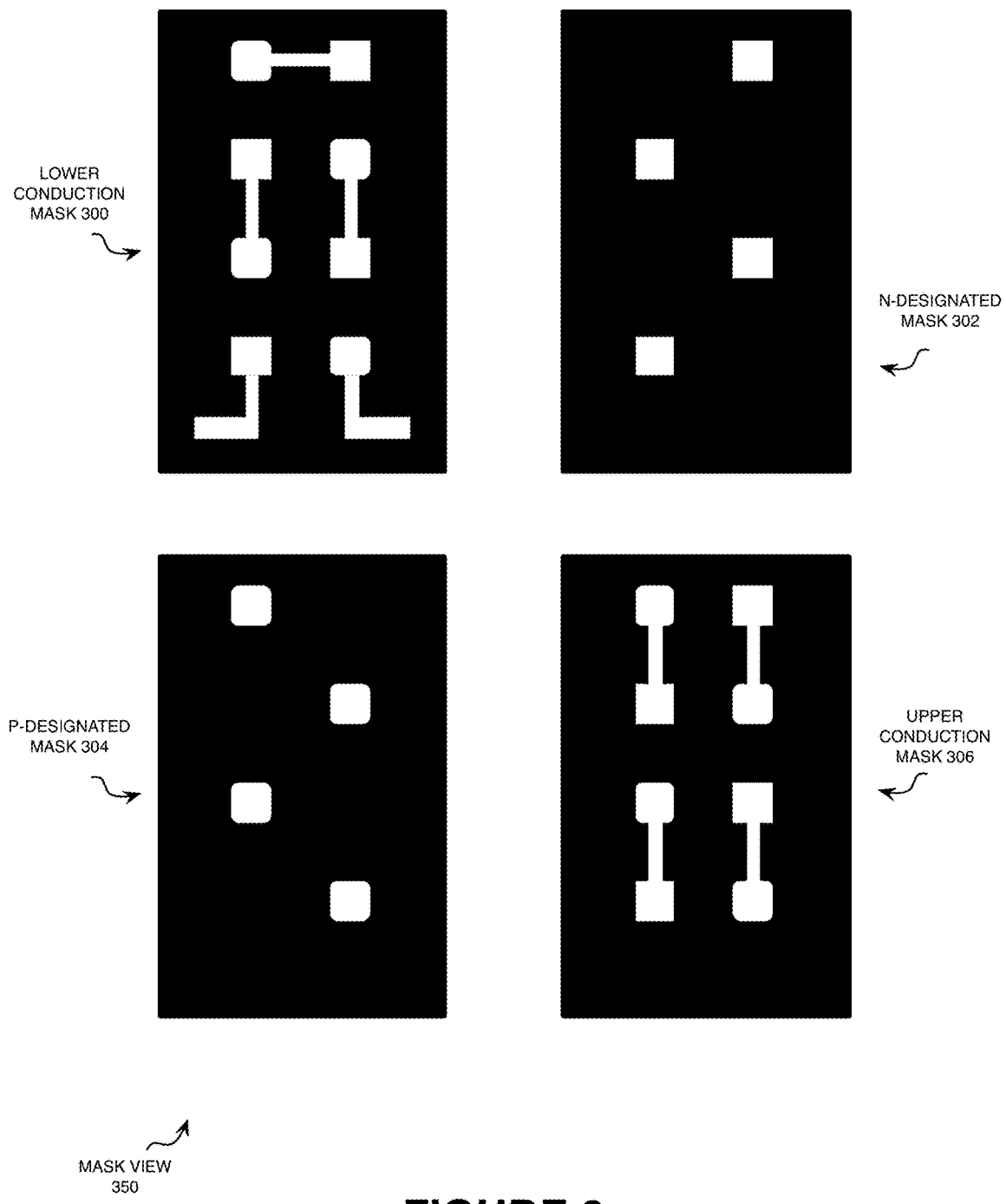
FIG. 3 shows a mask view of a series of example masks used to create the various layers of the flexible thermoelectric device of FIG. 1, according to one embodiment.

FIG. 3 shows a mask view 350 of a series of example masks used to create the various layers of the flexible thermoelectric device 100 of FIG. 1, according to one embodiment. Particularly, FIG. 3 shows a lower conduction mask 300, a N-designated mask 302, a P-designated mask 304, and an upper conduction mask 306.

A mask (e.g. the lower conduction mask 300 of FIG. 3, etc.) may be a patterned metal film which allows selective modification or access to portions of underlying material. Masks are sometimes also referred to as stencils, or shadow masks.

A lower conduction mask 300 is a mask which may be used to depose conductive material to create electrically conductive pads 110 and/or electrically conductive leads 116 which bridge electrically conductive pads 110. An N-designated mask 302 may be a mask which may be used to depose material to form one or more N-type conduits 200. A P-designated mask 304 may be a mask which may be used to depose material to form one or more P-type conduits 202.

An upper conduction mask 306 is a mask which may be used to deposit conductive material to create electrically conductive contacts 114 and/or electrically conductive leads 116 which bridge electrically conductive contacts 114.

The various layers of the flexible thermoelectric device 100 of FIG. 1 may be deposited or applied using a number of methods which utilize masks. For example, in one embodiment, a mask may be applied to the substrate before being exposed to vacuum deposition; the mask will only allow the deposition of material in the desired areas. Another example is the use of a mask in conjunction with silk screening resist 604 on a metal clad lower dielectric layer 600. Yet another example is the use of a mask for screen printing a conductive paste 222 to create a upper conduction layer 106.

Figure 4:
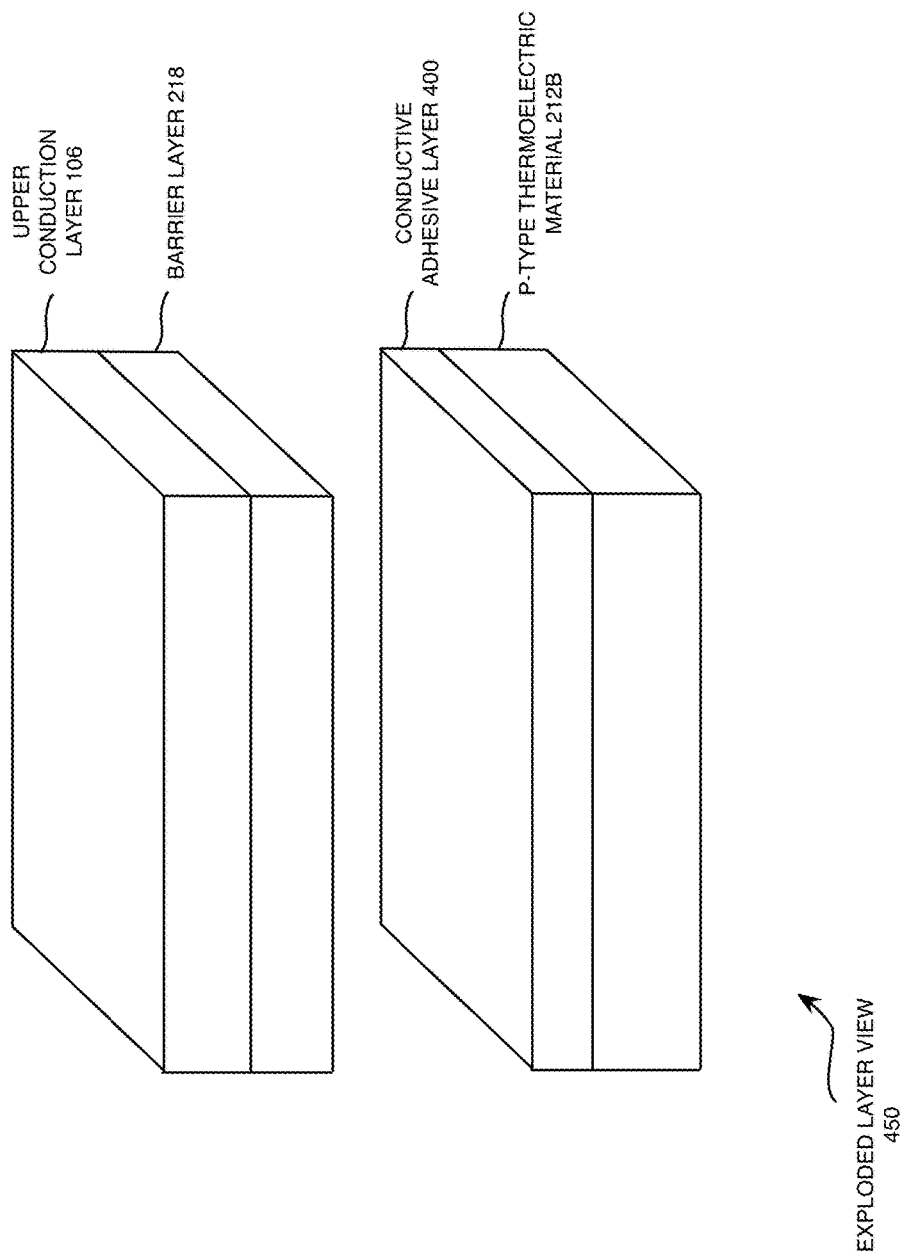
FIG. 4 shows an exploded layer view of a conductive adhesive layer between a P-type thermoelectric material of FIG. 2 and a barrier layer of FIG. 2, according to one embodiment.

FIG. 4 shows an exploded layer view 450 of a conductive adhesive layer 400 between a P-type thermoelectric material 212 of FIG. 2 and a barrier layer 218 of FIG. 2, according to one embodiment. Particularly, FIG. 4 shows a conductive adhesive layer 400, in addition to the upper conduction layer 106 of FIG. 1, as well as the barrier layer 218 and P-type thermoelectric material 212 of FIG. 2.

A conductive adhesive layer 400 may be a thin layer of electrically conductive material which assists in the bonding of one material (e.g. a thermoelectric material 118, a conductive material, a barrier material, etc.) with another material or layer. The conductive adhesive layer 400 may be an epoxy, a polymer film, a metallic compound applied as a thin film, and/or a material with a crystal structure which is intermediate to that of the two surrounding substances. It should be noted that, in FIG. 4, the upper conduction layer 106 of FIG. 1 has been abstracted to a slab, but still comprises electrically conductive contacts 114 and electrically conductive leads 116, according to various embodiments.

Where two layers or substances require adhesion, maybe because the materials may not be amenable to adhesion through other methods, a conductive adhesive may be introduced to attach them, according to one embodiment. In another embodiment, the physical process of annealing may allow the substances to adhere, where the materials of those layers may allow welding. In some embodiments, cold pressing and annealing may be employed to get the right properties for a higher ZT value of the device depending on the material system. For example, a composite device containing Bismuth Telluride may be annealed in vacuum or inert atmosphere around 300 degrees Celsius.

Figure 5:
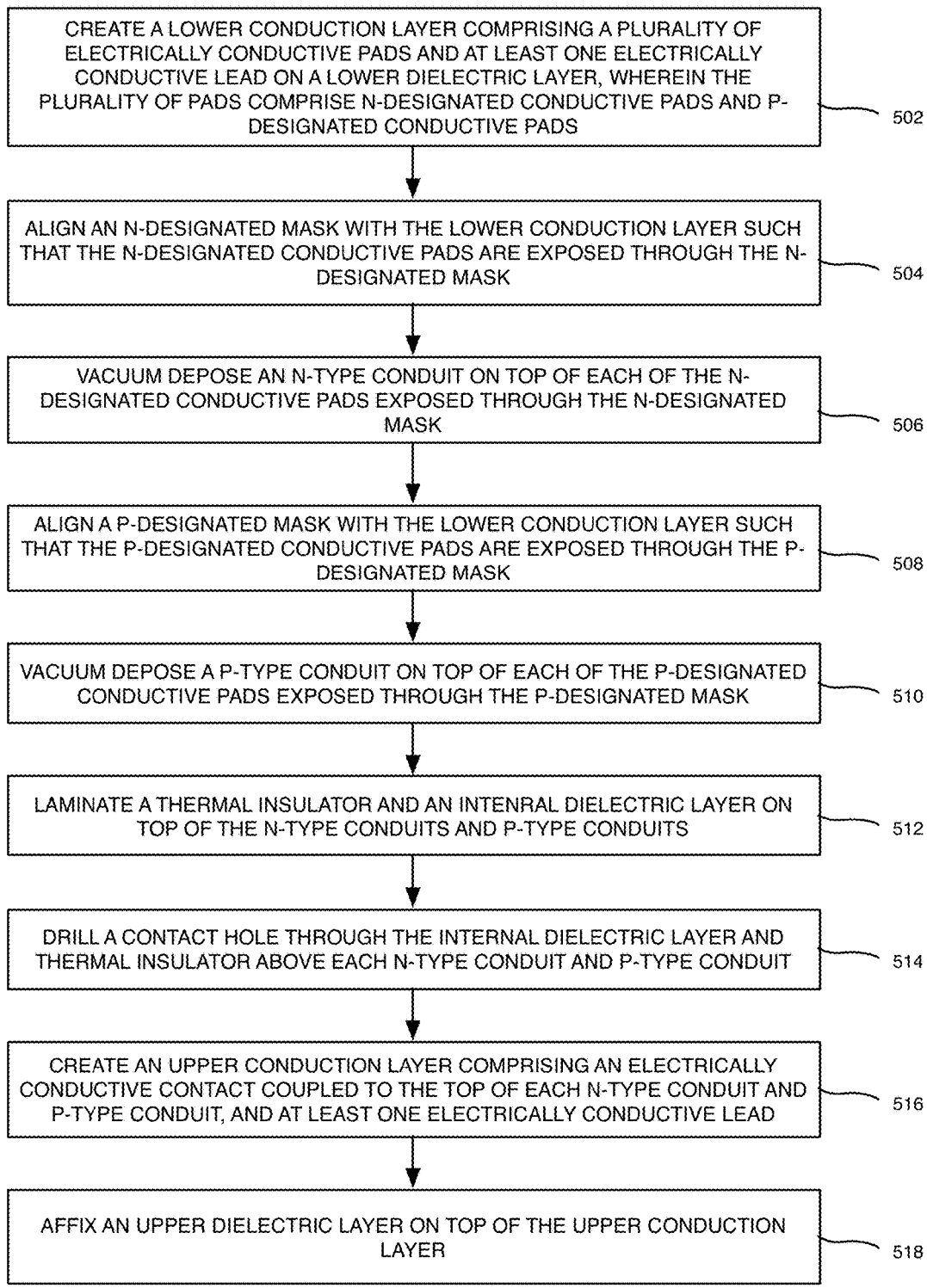
FIG. 5 shows a process flow to produce flexible thermoelectric devices from directly deposited thermoelectric materials, according to one embodiment.

FIG. 5 shows a process flow to produce flexible thermoelectric devices 100 from directly deposited thermoelectric materials 118, according to one embodiment.

In operation 502, a lower conduction layer 104 may be created, comprising a plurality of pads and at least one electrically conductive lead 116 on a lower dielectric layer 108. The plurality of electrically conductive pads 110 may comprise N-designated conductive pads 206 and P-designated conductive pads 208, according to various embodiments.

In operation 504, an N-designated mask 302 may be aligned with the lower conduction layer 104 such that the N-designated conductive pads 206 are exposed through the N-designated mask 302. In operation 506, an N-type conduit 200 may be vacuum deposited on top of each of the N-designated conductive pads 206 exposed through the N-designated mask 302. The N-type conduit 200 comprises at least one N-type thermoelectric material 210.

In operation 508, a P-designated mask 304 may be aligned with the lower conduction layer 104 such that the P-designated conductive pads 208 are exposed through the P-designated mask 304. In operation 510, a P-type conduit 202 may be vacuum deposited on top of each of the P-designated conductive pads 208 exposed through the P-designated mask 304. The P-type conduit 202 comprises at least one P-type thermoelectric material 212.

In operation 512, a thermal insulator 112 and an internal dielectric layer 203 may be laminated on top of the N-type conduits 200 and P-type conduits 202, such that the thermal insulator 112 fills at least a space around each N-type conduit 200 and P-type conduit 202. In the context of the present description, lamination may refer to a process which comprises the application of a layered material using heat and/or pressure. As a specific example, a sheet of prepeg (e.g. a thermal insulator 112) may be applied on top of the thin film thermoelectric conduits 102, followed by a sheet of Teflon (e.g. an internal dielectric layer 203). The entire device is pressed at 150 degrees Celsius, until the prepeg has filled all of the space around the thin film thermoelectric conduits 102.

In operation 514, a contact hole 220 may be drilled through the internal dielectric layer 203 and thermal insulator 112 above each N-type conduit 200 and each P-type conduit 202. In the context of the present description, drilling may refer to a process of creating a hole or channel. In one embodiment, the drilling may be performed using a laser drilling system.

In operation 516, an upper conduction layer 106 may be created, comprising an electrically conductive contact 114 coupled to the top of each N-type conduit 200 and P-type conduit 202, and at least one electrically conductive lead 116. The electrically conductive contacts 114 may run through the contact holes 220, according to various embodiments. In operation 518, an upper dielectric layer 204 may be affixed on top of the upper conduction layer 106. In one embodiment, affixing may refer to adhering two surfaces together using a thermal adhesive, such as prepeg or a similar resin.

According to various embodiments, a portion of the upper conduction layer 106 may be between the internal dielectric layer 203 and the upper dielectric layer 204. Furthermore, pairs of electrically conductive pads 110 may be bridged with electrically conductive leads 116, and pairs of electrically conductive contacts 114 may be bridged with electrically conductive leads 116, such that all of the thin film thermoelectric conduits 102 are connected in series.

Figure 6:
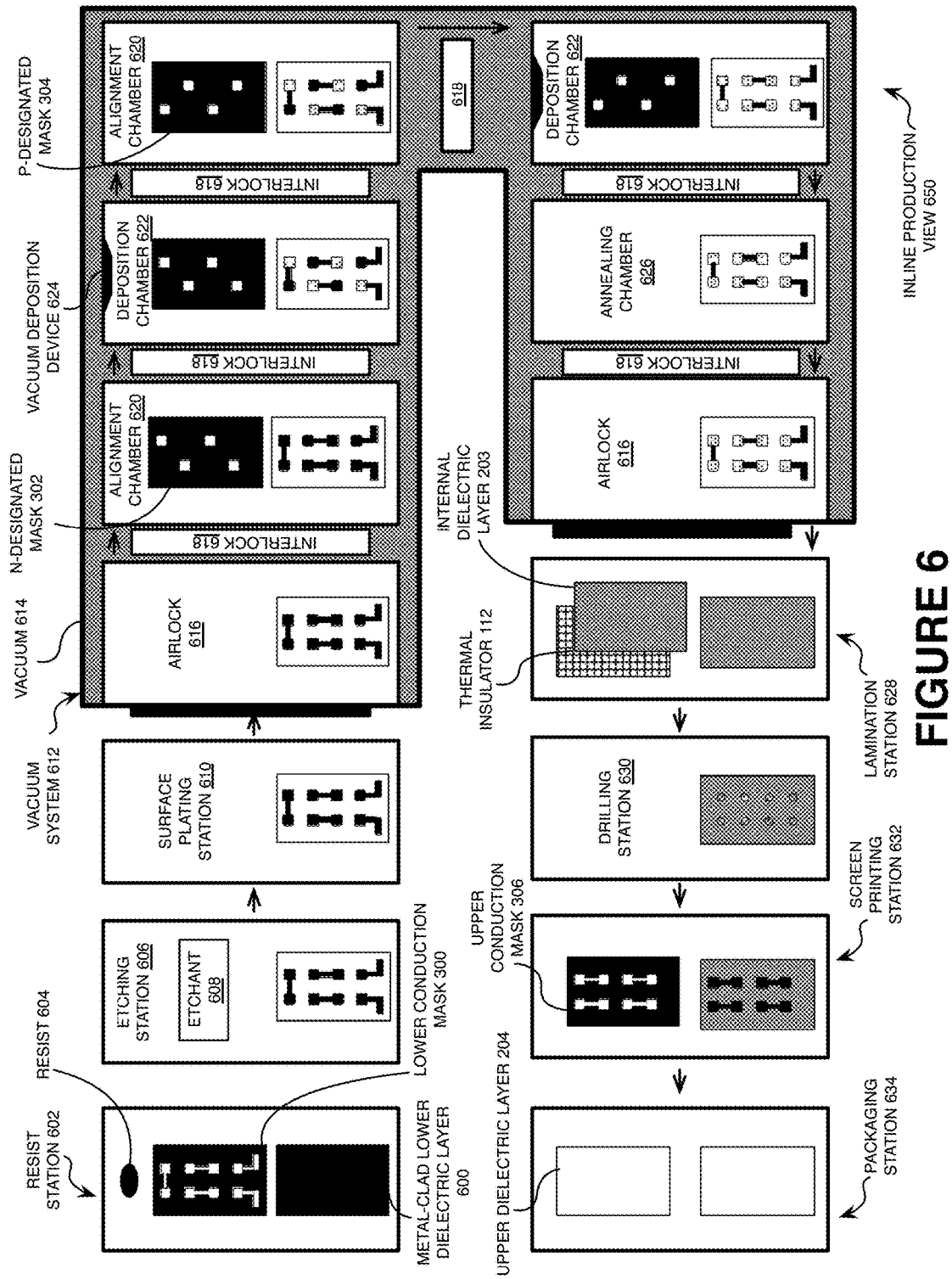
FIG. 6 shows an inline production view of a process for producing the flexible thermoelectric device of FIGS. 1 and 2 within a single vacuum system, according to one embodiment.

FIG. 6 shows an inline production view 650 of a process for producing the flexible thermoelectric device 100 of FIGS. 1 and 2 within a single vacuum system 612, according to one embodiment. Specifically, FIG. 6 shows a metal-clad lower dielectric layer 600, a resist station 602, a resist 604, an etching station 606, an etchant 608, a surface plating station 610, vacuum system 612, a vacuum 614, an airlock 616, an interlock 618, a mask alignment chamber 620, a deposition chamber 622, a vacuum deposition device 624, an annealing chamber 626, a lamination station 628, a drilling station 630, a screen printing station 632, and a packaging station 634, in addition to the lower conduction mask 300, the N-designated mask 302, the P-designated mask 304, and the upper conduction mask 306 of FIG. 3, as well as the internal dielectric layer 203 and the upper dielectric layer 204 of FIG. 2 and the thermal insulator 112 of FIG. 1.

A metal-clad lower dielectric layer 600 may be a lower dielectric layer material which has been electroplated with a metallic compound (e.g. copper-clad Kapton tape, etc.). A resist station 602 may be a station or system which may be used to apply resist 604 to a metal-clad lower dielectric layer 108 for the purpose of etching a pattern in the metal cladding 214. In some embodiments, the resist station 602 may be automated, as part of an in-line process for efficiently producing flexible thermoelectric devices 100.

In one embodiment, the resist station 602 may apply resist 604 to the metal-clad lower dielectric layer 108, then align a lower conduction mask 300. Once the lower conduction mask 300 is aligned, the resist 604 may be exposed to a particular wavelength of light (e.g. ultraviolet, etc.) to cure the exposed resist, after which the uncured resist is washed off. Another method for applying resist 604 is the use of silk screening methods to apply the resist 604 only to areas where the cladding is desired. These and other methods of applying resist 604 in preparation for etching are known in the microfabrication industry.

A resist 604, or photoresist, may be a chemical which is able to withstand an etchant 608. In some instances, the resist 604 may be light sensitive, for use in photolithography. In other embodiments, the resist 604 may be compatible with a silk screen process, to apply the resist 604 in a particular pattern to create, at least in part, the lower conduction layer 104.

An etching station 606 may be a station or system which may expose a metal-clad lower dielectric layer 108 to an etchant 608 to remove metal cladding 214 not protected by cured resist 604, according to one embodiment. The etching station 606 may be automated, as part of an in-line process for efficiently producing flexible thermoelectric devices 100. An etchant 608 may be an acid or corrosive chemical used in etching.

A surface plating station 610 may be a station or system for applying a conductive layer of surface plating. A vacuum 614 be a space or container from which the air has been completely or partially removed. In the context of the present description, a vacuum 614 may refer to a reduction of air pressure to a level needed for vacuum deposition.

A vacuum system 612 may be a system of containers and pumps which may achieve a vacuum 614. In the context of the present description, a vacuum system 612 may refer to a series of chambers which are all part of the same vacuum 614. An airlock 616 may be a chamber which allows the input and output of materials (e.g. flexible thermoelectric devices 100, etc.) to a vacuum system 612 without requiring the breaking and restoration of the vacuum 614 for the entire system. An interlock 618 may be a chamber or aperture which may be used to separate two chambers within a vacuum system 612. The interlocks 618 may be used to prevent contamination between chambers (e.g. prevents material from a deposition chamber 622 from entering an alignment chamber, etc.).

A mask alignment chamber 620 may be a chamber within a vacuum system 612 where a mask may be aligned with an object (e.g. a lower dielectric layer 108, etc.). In various embodiments, the mask alignment may be accomplished in an automated manner. A deposition chamber 622 may be a chamber within a vacuum system 612 where the deposition of materials may be performed using a vacuum deposition method.

A vacuum deposition device 624 may be a device which may be used to deposit layers of material atom-by-atom or molecule-by-molecule, at pressures well below atmospheric pressure. For example, for the vacuum deposition process known as sputtering, the deposition device bombards a solid target with energetic particles such that atoms are ejected and deposited on a solid surface. An annealing chamber 626 may be a chamber within a vacuum system 612 where annealing (e.g. controlled heating and cooling of a material to change properties, etc.) may be performed.

In the context of the present description, a lamination station 628 may refer to a station or system which applies and/or adheres one or more layers of material onto another surface using heat, pressure, and/or adhesive. As a specific example, the lamination station 628 may be used to apply a layer of thermal insulator 112 (e.g. a sheet of prepeg, etc.) and an internal dielectric layer 203 (e.g. a sheet of Teflon, etc.) on top of a partially assembled device (e.g. on top of the thin film thermoelectric conduits 102, etc.). Thereafter, pressure and heat are applied until the thermal insulator 112 has filled the space surrounding the thin film thermoelectric conduits 102.

The drilling station 630 may be a station of system which may create holes or channels in an object. The drilling may be accomplished through a variety of methods, including but not limited to, laser drilling and mechanical drilling. The screen printing station 632 may be a station where a conductive paste 222 or other conductive material may be applied in a predefined pattern using a mask or stencil, according to various embodiments. The packaging station 634 may be a station where the packaging of a flexible thermoelectric device 100 may be packaged by affixing an upper dielectric layer 204 on top of the internal dielectric layer 203 and/or upper conduction layer 106.

FIG. 6 illustrates a specific example of an inline production setup for efficiently producing flexible thermoelectric devices 100. As shown, the creation of the lower conduction layer 104 is accomplished by applying resist 604 to a metal-clad lower dielectric layer 108 at the resist station 602, and then etching the electrically conductive pads 110 at the etching station 606. Those pads then receive a surface plating layer 216 at the surface plating station 610. All of this is in accordance with one embodiment. In other embodiments, other methods (e.g. sputter deposition of the electrically conductive pads 110 on a lower dielectric layer 108 using a lower conduction mask 300, etc.) may be employed in the creation of the lower conduction layer 104. Some of these methods, such as etching and surface plating, do not require the use of a vacuum 614, and may thus be excluded from the vacuum system 612.

As shown, once the lower conduction layer 104 has been created, it is introduced to the vacuum system 612 through an airlock 616, to reduce the amount of evacuation needed for each breach of the vacuum 614. Each of the chambers is separated by an interlock 618, which may be opened to allow a flexible thermoelectric device 100, at various stages of assembly, to pass through, and then closed to confine the materials associated with the various depositions from contaminating other chambers or devices.

As depicted in FIG. 6, the inline production system may employ a different chamber for each step of the process, according to one embodiment. In other embodiments, certain chambers may be used more than once. For example, all mask alignments may be performed in the same chamber, or perhaps there may only be one deposition chamber 622, where all materials are applied. In this way, the overall cost of the inline production system may be reduced.

In some cases, a flexible thermoelectric device 100 may need to be annealed, to improve the thermoelectric properties, or possibly the mechanical properties, of the thermoelectric device. According to one embodiment, this may be done in the annealing chamber 626. As an option, this may be done before the application of the upper conduction layer 106, to avoid leaching of the conducting materials into the thermoelectric materials 118. In some circumstances (e.g. barrier layers 218 are being used, etc.), it may not be necessary to delay the application of the upper conduction layer 106 until after annealing.

As depicted in FIG. 6, the incorporation of the thermal insulator 112 and the internal dielectric layer 203, as well as the formation of the upper conduction layer 106, may be accomplished using stations outside of the vacuum system 612. In other embodiments, these steps may be accomplished within the vacuum system 612. As an option, some or all of these layers may be applied using vacuum deposition methods.

The production of the flexible thermoelectric device 100 by these means may optimize crystallinity in the physical structure of the flexible thermoelectric device 100, control grain growth, and maintain structural control. The flexible thermoelectric device 100 may be manufactured with these variables in mind and the production of the flexible thermoelectric device 100 may allow the manufacturer to control for these variables according the optimal parameters.

Additionally, according to one embodiment, the flexible thermoelectric device 100 has no size restrictions and thus lends itself to scaling. The flexible thermoelectric device 100 may be sized according to the application.

Figure 7:
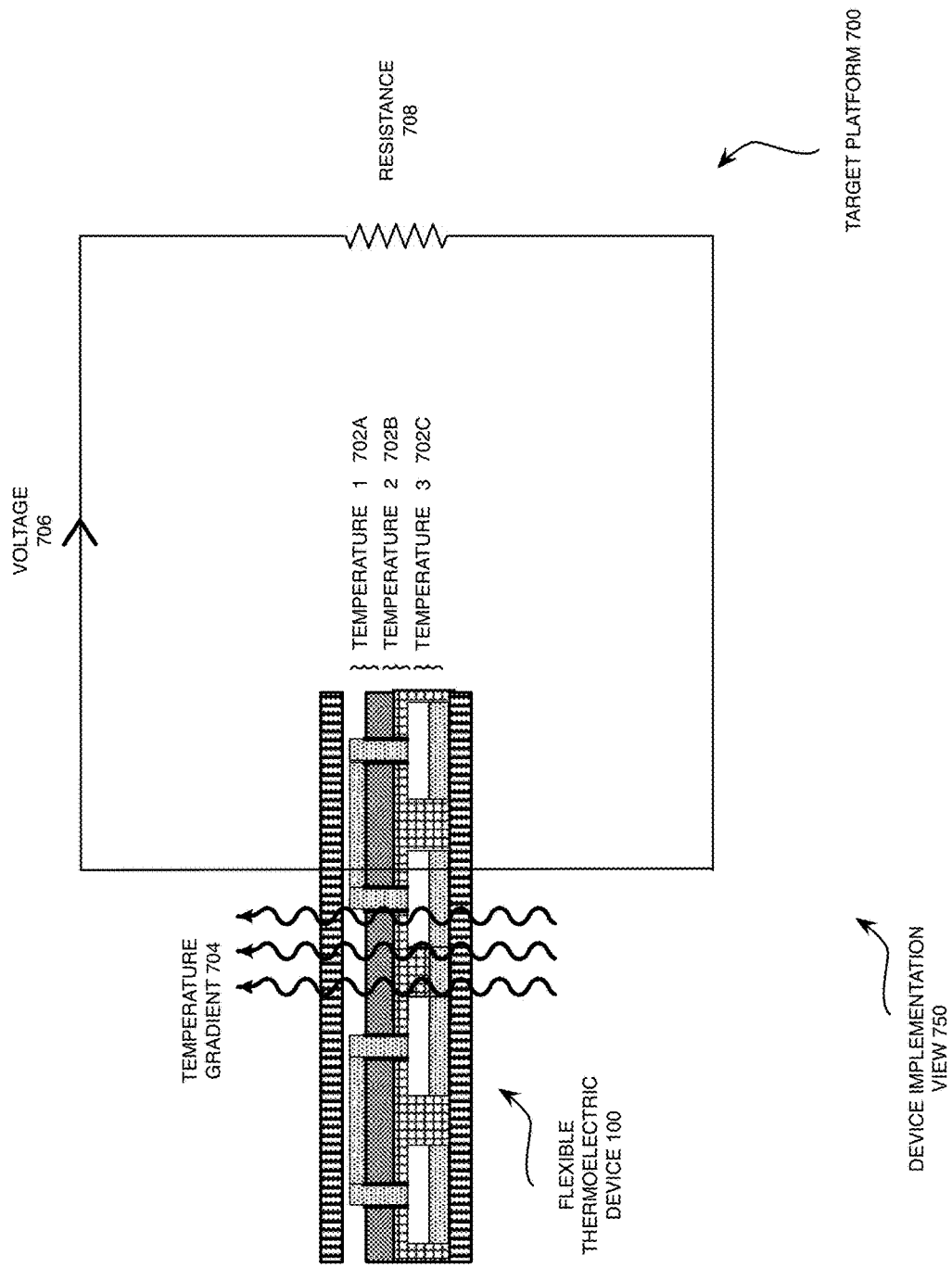
FIG. 7 shows a device implementation view of the flexible thermoelectric device of FIGS. 1 and 2 placed within a temperature gradient, according to one embodiment.

FIG. 7 shows a device implementation view 750 of the flexible thermoelectric device 100 of FIGS. 1 and 2 placed within a temperature gradient 704, according to one embodiment. Particularly, FIG. 7 shows a target platform 700, a plurality of temperatures 702, a temperature gradient 704, a voltage 706, and a resistance 708, in addition to the flexible thermoelectric device 100 of FIG. 1.

A temperature 702 may be a comparative measurement of the heat present in an object, or part of an object. A temperature gradient 704 may be an increase or decrease in the temperature 702 observed in passing from one point to another. A voltage 706 may be an electric energy charge difference of electric potential energy transported between two points. An internal resistance 708 may be the resistance which accounts for the voltage drop which occurs when a current is being driven by a power source.

When there may be a temperature gradient 704 through the flexible thermoelectric device 100, with decreasing temperatures 702 at points along the depth of the device, the voltage may be generated. An internal resistance 708 may be present in the electric circuit.

A target platform 700 may be a device intended to receive power from the flexible thermoelectric device 100. One potential class of a target platforms 700 is building materials. The thin nature of the flexible thermoelectric device 100 makes it ideal for placement on windows, harvesting energy from the temperature 702 differential between a climate controlled interior of a home and the sunlit exterior. A window covering need not block all light; in one embodiment, the flexible thermoelectric device 100 could be part of a lattice dividing a window into smaller panes. In other embodiments, the flexible thermoelectric device 100 could be shaped in a decorative pattern. Another example of flexible thermoelectric device 100 being incorporated into building materials is wrapping pipes (e.g. recovering waste heat, etc.), Another class of target platforms 700 for which the flexible thermoelectric device 100 is well suited is "smart clothing." Interest in biological sensors used for monitoring health (e.g. heart monitors, skin alkalinity sensors, perspiration sensors, accelerometers, etc.) is increasing, and as these devices and sensors grow smaller, they will likely start to be incorporated into clothing. The flexible thermoelectric device 100 would allow these devices to be powered by the difference between the ambient temperature and the user's body heat.

Other target platforms 700 which may use the flexible thermoelectric device 100 to harvest energy from human body heat include jewelry, handheld devices, and wearable devices. Circuitry may be incorporated into jewelry for a number of reasons (e.g. decorative, health monitoring, digital input such as a microphone, digital output such as a headphone, etc.). However, due to size requirements, a system which can harvest energy for such a device may be preferable over a rechargeable storage system. The flexible thermoelectric device 100 is well suited for use in jewelry, due to its dimensions and its ability to bend fit the shape of the target platform 700. In other embodiments, target platforms may also include a silicon wafer or thin film photovoltaic cell in a solar panel.

Handheld devices, such as remote controls, often do not require large amounts of energy, but instead need small bursts of electricity to send a signal to another device. In one embodiment, a flexible thermoelectric device 100 may be used to power a remote control (e.g. for a television, etc.) by harvesting the heat in the users hand. The flexible thermoelectric device 100 is also well suited for use in small sensors, such as those employed in Internet of Things (IoT) solutions.

Wearable devices are increasing in popularity, but one of the biggest challenges is a practical battery life. According to various embodiments, flexible thermoelectric devices 100 may be incorporated into the band of a smart watch, harvesting energy from the heat within the user's wrist to trickle charge the device. See, for example, FIG. 8.

Other examples of target platforms 700 include devices which require power, but must maintain a small form-factor, such as a credit card. As security concerns grow, credit and identification cards will need to employ more sophisticated technology to safeguard against abuse. According to one embodiment, the flexible thermoelectric device 100 of FIG. 1 could power the circuitry inside the next generation of credit cards using the difference between the ambient temperature 702 and the user body heat as they hold the card.

A thermal adhesive layer may be a layer of material which may be used to attach the flexible thermoelectric device 100 to a target platform 700. According to various embodiments, the thermal adhesive layer may be chosen such that it has a high thermal conductivity, is electrically insulating, and has a coefficient of expansion close enough to that of the target platform 700 that adhesion will not be broken when exposed to the foreseeable temperature range of the target platform 700. Examples of materials which may be used as a thermal adhesive layer include, but are not limited to, ethyl vinyl acrylate (EVA), and a combination of an adhesive (e.g. epoxy, prepeg, etc.) and a dielectric material (e.g. Teflon, etc.). In other embodiments, the thermal adhesive layer may be used to encapsulate the flexible thermoelectric device 100.

Figure 8:
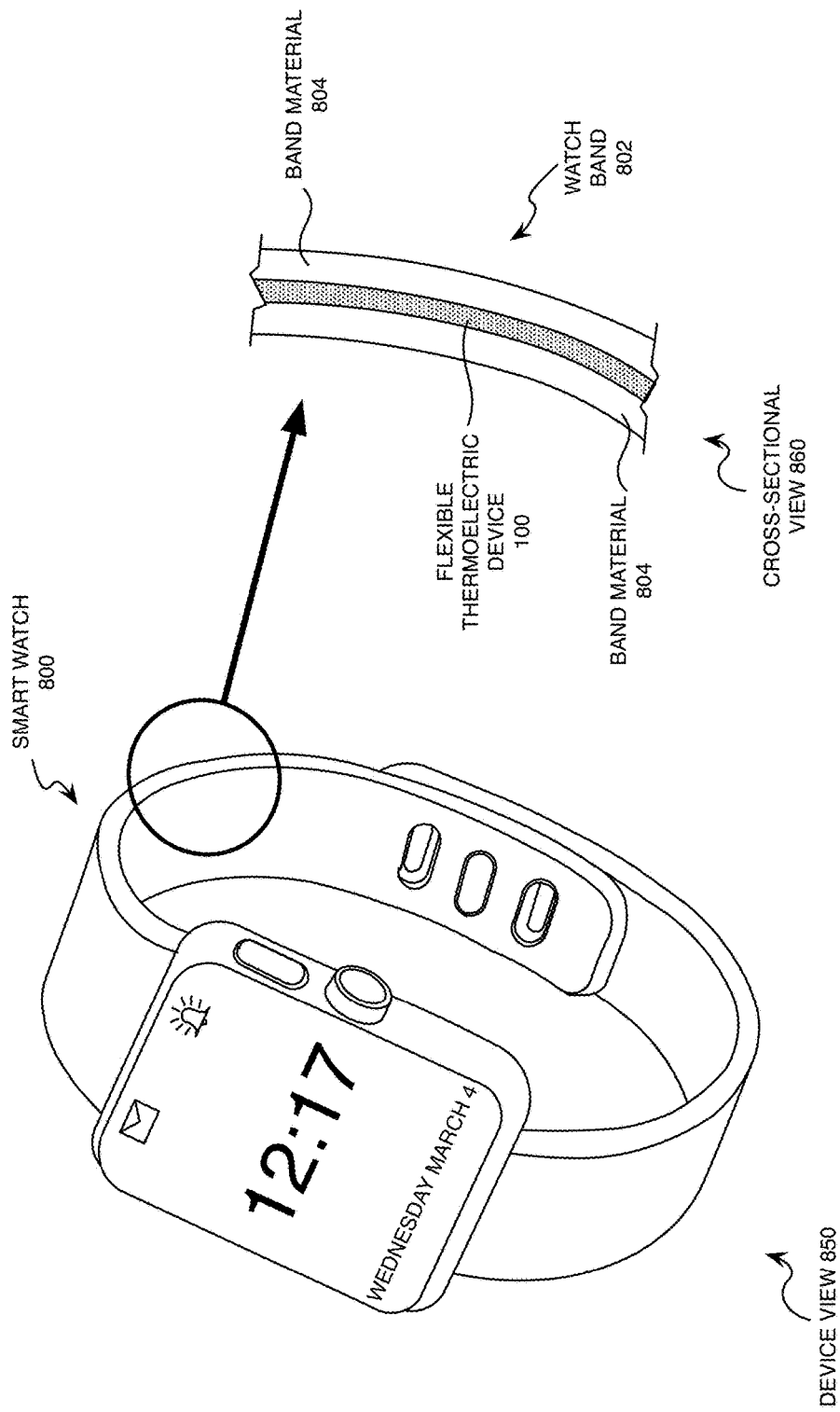
FIG. 8 shows a device implementation view of the flexible thermoelectric device of FIGS. 1 and 2 incorporated into the band of a smart watch, according to one embodiment.

FIG. 8 shows a device implementation view 850 and cross sectional view 860 of the flexible thermoelectric device 100 of FIGS. 1 and 2 incorporated into the band of a smart watch 800, according to one embodiment. Specifically, FIG. 8 shows a smart watch 800, a watch band 802, and a band material 804, in addition to the flexible thermoelectric device 100 of FIGS. 1 and 2.

The smart watch 800 may be a computerized, wrist-mounted device which functionality which extends beyond timekeeping. Typically, smart watches 800 have higher power requirements than traditional watches or other timekeeping devices. The watch band 802 may be a strap or enclosure which may be used to secure a watch or watch-like device to a user's wrist. The band material 804 may be a material which a watch band 802 is made of. Not shown are the conductive traces which electrically couple the flexible thermoelectric device 100 within the watch band 802 to the power system of the smart watch 800.

Wearable devices, and especially smart watches 800, are becoming increasingly popular. One of the challenges faced by smart watch 800 creators is providing sufficient battery life that charging is not required so often that it is overly disruptive of the user experience. As shown, by embedding a flexible thermoelectric device 100 inside the watch band 802 of a smart watch 800 may augment or possibly replace the power provided by the smart watch battery. Constructing the watch band 802 using a band material 804 that has a high thermal conductivity may improve performance.

The watch band 802 may be designed in such a way that the transfer of thermal energy from the user's body to the atmosphere is directed through the flexible thermoelectric device 100 (which, as previously discussed, may be optimized such that the temperature gradient is localized within the thin film thermoelectric conduits 102 of the active layer 101). For example, in one embodiment, the band material 804 directly above and below the flexible thermoelectric device 100 may have a high thermal conductivity, while the band material 804 along the sides of the watch band 802 may have a low thermal conductivity.

In one embodiment, an energy harvesting thermoelectric watch band 802 may include more than one flexible thermoelectric device 100. For example, a first thermoelectric device may be optimized for a temperature range closer to the average body temperature of a human, while a second thermoelectric device may be optimized for a temperature range closer to average room temperature. These two devices may be layered within the watch band 802 such that the first device is closer to the inside of the watch band 802, and the second device is closer to the outside of the watch band 802. In other embodiments, additional flexible thermoelectric devices 100 may be used within the watch band 802.

Low efficiency, high operating temperature combined with higher cost forbid current thermoelectric devices for wider market adoption. Low efficiency may relegate thermoelectric devices to a few applications where their simplicity and ruggedness may outweigh the inefficiency, such as sensors and waste-heat-energy converters. The potential for thermoelectric devices, however, may be much greater. If their efficiency may be increased and reduce the operational temperatures near room temperature (300K), thermoelectric devices may begin to supplant mechanical compressor refrigeration systems, gasoline generators, geothermal power production, and more. Thermoelectric devices may play a significant role in the energy production, home heating/cooling and general energy management of the future.

Low thermal conductivity with higher electrical conductivity is needed for higher ZT. Unfortunately there are no single materials that possess simultaneously higher electrical conductivity and lower thermal conductivity. Most of the recent efforts in research community thus have been reducing thermal conductivity by phonon blocking and/or phonon scattering and/or reducing phonon free mean path.

Thermoelectric devices may be made out of bulk material in the form of ingots and/or pellets. The ingot may be formed from liquid melt and/or from the powder metallurgy route. Each pellet may be attached on a substrate and form a module.

Recent advancements may be made using a thin-film process that allows forming micro bumps using common semiconductor equipment. This allows thousands of micro bumps to form a thermoelectric device to produce meaningful voltage and power output.

Metal particles may be incorporated in a thermoelectric material 118 to form a composite structure. Nanophase metal particles in a polymer matrix may be utilized to form a composite thermoelectric device. Ceramic nanoparticles may be introduced as phonon scattering centers in a thermoelectric device to improve the figure of merit (ZT), which may occur with nano-carbon material units in a thermoelectric matrix.

Quantum super lattice structures may be limited to expensive composite thermoelectric materials 118 and methods and thus limiting the wide spread use of such devices in common market place. Thermoelectric components may be placed in series, but the thermal conductivity may be diminished because the interconnections between the semiconductors may create thermal shorting.

There may be no material that possesses high electrical conductivity and low thermal conductivity simultaneously. Another limitation in current art is each material may behave differently at different temperatures. A thermoelectric cell approach with a flexible substrate may permit stacking.

Stacking allows combining different materials with different properties, and may be with or without a spacer. Thermoelectric elements may be connected electrically in series, but thermally in parallel across a temperature gradient. Stacking may allow manufacturers to control electrical conductivity and thermal conductivity independently, and may be able to stack different materials. In one embodiment, the stacked layer may be a single N-type or P-type stack. Additionally, there may be a super lattice for each layer.

A refrigerating effect may be obtained in the flexible thermoelectric device 100 by passing current along a circuit containing dissimilar materials, according to one embodiment. Heat may be absorbed at one junction of the two materials and heat may be released at the other junction, according to one embodiment.

The transfer of heat may be caused by the change in electron energy levels when electrons access the conduction band as defined by quantum physics. The conduction band varies with each material, which means that conducting electrons in some materials may be at a higher energy level than in other materials. When electrons pass down a circuit of dissimilar materials, the electrons alternately extract energy and/or release energy with each change in the conduction band.

The desired refrigerating effect may occur when electrons move to a higher energy level upon change of material. A reverse effect may also occur when electricity is generated from a circuit of dissimilar materials that may be exposed to a temperature differential. This is the physical principle that forms the basis of the thermocouple and is known as the Seebeck effect. The Peltier and Seebeck effects are complementary manifestations of the same physical phenomenon.

There are other applications for the flexible thermoelectric device 100. Voltage generation from temperature differentials in a wide array of situations in different fields offer the potential for application of the flexible thermoelectric device 100. The flexible thermoelectric device 100 may be used in medical applications, e.g. cochlear hearing replacements and devices, nerve stimulation implants; consumer applications, e.g. watches, self-powered toys and novelties; military applications, e.g. wireless personal area networks, ammunition safety sensors, space programs, building environmental control and security.

The flexible thermoelectric device 100 may be integrated to power industrial and/or commercial devices, e.g. wireless sensor networks, automobile tire pressure monitors, wireless HVAC sensors, wireless lighting an energy controls, wireless industrial process control sensors, and oil and gas well head sensors. The flexible thermoelectric device 100 may provide ecological and/or energy applications, e.g. secondary power generation/recovery, electric generation grid device monitor sensors, and environmental condition sensors.

In the field of building automation, the flexible thermoelectric device 100 may have practical applications in security, HVAC, automatic meter reading, lighting control, and access control. In the area of personal health care, the layer composite may have applications in patient monitoring and fitness monitoring. The flexible thermoelectric device 100 may have industrial control applications, e.g. asset management process control and environmental energy management.

Consumer electronics applications may include televisions, VCRs, DVD/CD remotes and/or players, mobile phones, tablets, laptops, household appliances, computer mice, keyboards, joysticks, and/or personal computers and computing peripherals. Residential/light commercial control applications of the layer composite may include security, HVAC, lighting control, access control, and/or lawn & garden irrigation systems.

In one embodiment, while thermally conductive, the flexible thermoelectric device 100 may effectively maintain the temperature differential between opposite ends of the flexible thermoelectric device 100. Thereby, the flexible thermoelectric device 100 may create temperature differentials that may be persistent and thus may optimize the voltage generation from a temperature gradient.

The resistance to heat transfer attributable to the flexible thermoelectric device 100 perpetuates the overall temperature differential and thus may effectively sustain the temperature gradient across each stratum of the thermoelectric layers and accordingly the flexible thermoelectric device 100 as a whole. Because of this resistance to heat transfer, the flexible thermoelectric device 100 may serve as a more efficient means of voltage generation since the temperature differentials at each layer of thermoelectric material 118 may not require additional heat sinks and/or energy-intensive cooling techniques that may be employed to maintain the temperature differential.

While serving as a thermoelectric device, the material composition of the thermoelectric layer may be altered and adjusted according to the specific needs of each application. The flexible thermoelectric device 100 is material independent, according to one embodiment. If the application of the flexible thermoelectric device 100 requires a specific temperature range, e.g. environments with temperatures higher than 800 degrees K, then a particular material may be employed in the thermoelectric layers. For example, Bismuth Telluride may be appropriate in one temperature range, while Silicon Germanium may be more suitable in another temperature.

The thermoelectric layer may include whatever material is most appropriate and best suited to the conditions of the application. Temperature may be one variable. Other factors may be electrical conductivity, malleability, texture, etc. Because the flexible thermoelectric device 100 is material independent, the material best suited for the relevant application may be chosen, thus optimizing the voltage generation and other properties for each application.

Additionally, because the flexible thermoelectric device 100 is material independent and because of the effectiveness of the flexible thermoelectric device 100 in maintaining a temperature gradient across its strata, multiple types of materials may be employed in composing the thermoelectric layer. For example, the thermoelectric layer may contain $Cu_2Te$, $Bi_2Te_3$, and/or $Sb_2Te_3$, all in one cell.

Because the thermoelectric layers may maintain a temperature differential effectively, materials impractical at one temperature may still be used in the thermoelectric layer at a different depth with a different temperature where the material may be practical. For example, if the hot surface of the flexible thermoelectric device 100 precludes use of one material because it may melt and/or not be as thermally or electrically conductive at that temperature, that material may still be utilized at the cooler end of the flexible thermoelectric device 100 because the flexible thermoelectric device 100 maintains the temperature differential and the material may be used toward the cool surface of the flexible thermoelectric device 100. Thus, the flexible thermoelectric devices 100 characteristic of sustaining the temperature gradient may permit the combination of different materials and thereby optimize the inherent properties of component materials.

The flexible thermoelectric device 100 may have a stratum-like structure, according to one embodiment. Because the flexible thermoelectric device 100 inhibits the flow of heat across the layers, there may be a relatively smaller temperature differential per each layer. However, because the flexible thermoelectric device 100 may comprise as many layers as a manufacturer and/or consumer desire, according to one embodiment, the temperature differentials across each layer may sum up to a larger overall temperature differential across the entire device.

The flexible thermoelectric device 100 may harvest energy from waste heat at lower costs with a higher ZT value, higher efficiency, lower manufacturing costs, and may be easily integrated into existing manufacturing process systems for applications. Furthermore, because of its flexibility, the device may be used in other wearable electronics to utilize body heat.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims. Furthermore, the specification and/or drawings may be regarded in an illustrative rather than a restrictive sense.

What is claimed is:

1. A flexible thermoelectric device, comprising:
   a lower dielectric layer comprising flexible material to provide structure to the flexible thermoelectric device;
   a lower conduction layer comprising a plurality of electrically conductive pads disposed directly on and across a surface of the lower dielectric layer, the plurality of electrically conductive pads comprising a plurality of N-designated conductive pads and a plurality of P-designated conductive pads, where the plurality of electrically conductive pads are arranged in pairs such that each pair comprises one N-designated conductive pad of the plurality of N-designated conductive pads and one P-designated conductive pad of the plurality of P-designated conductive pads that are adjacent to one another across the surface of the lower dielectric layer, where the N-designated conductive pad and the P-designated conductive pad in each pair are electrically coupled to one another through an electrically conductive lead extending between the N-designated conductive pad and the P-designated conductive pad adjacent to one another in the pair, the electrically conductive lead extending across the surface of the lower dielectric layer, being parallel to lengths of the N-designated conductive pad and the P-designated conductive pad in the pair, and being narrower in width compared to widths of the N-designated conductive pad and the P-designated conductive pad in the pair, where the widths of the N-designated conductive pad and the P-designated conductive pad are a dimension perpendicular to the length thereof;
   a plurality of N-type thin film thermoelectric conduits, each N-type thin film thermoelectric conduit on top of a respective N-designated conductive pad of the plurality of N-designated conductive pads, each N-type thin film thermoelectric conduit having a top surface and a bottom surface, where the bottom surface directly contacts the respective N-designated conductive pad, and the top surface is opposite to the bottom surface;
   a plurality of P-type thin film thermoelectric conduits, each P-type thin film thermoelectric conduit on top of a respective P-designated conductive pad of the plurality of P-designated conductive pads, each P-type thin film thermoelectric conduit having a top surface and a bottom surface, where the bottom surface directly contacts the respective P-designated conductive pad, and the top surface is opposite to the bottom surface;
   an internal dielectric layer comprising a flexible dielectric material extending across the top surfaces of all the N-type thin film thermoelectric conduits and all the P-type thin film thermoelectric conduits, the internal dielectric layer being electrically insulating, and a surface of the internal dielectric layer being parallel to the top surfaces of each N-type thin film thermoelectric conduit and each P-type thin film thermoelectric conduit;
   a thermal insulator to fill a space around each N-type thin film thermoelectric conduit and each P-type thin film thermoelectric conduit, the thermal insulator and the internal dielectric layer being laminated on top of the N-type thin film thermoelectric conduits and the P-type thin film thermoelectric conduits;
   a plurality of contact holes extending through the internal dielectric layer and the thermal insulator such that each contact hole extends through a thickness of the internal dielectric layer directly into a thickness of the thermal insulator, and ends on the top surface of the respective N-type thin film thermoelectric conduit or the respective P-type thin film thermoelectric conduit;
   a plurality of electrically conductive contacts, each electrically conductive contact fills a respective contact hole of the plurality of contact holes such that each electrically conductive contact extends perpendicularly through the respective contact hole from the top surface of the respective N-type thin film thermoelectric conduit or the respective P-type thin film thermoelectric conduit, through the thermal insulator, and through the thickness of the internal dielectric layer, where each electrically conductive contact includes an outward extension that emerges outward from the respective contact hole above the internal dielectric layer;
   a plurality of another electrically conductive leads, each of which bridges between the outward extension of a first respective electrically conductive contact of the plurality of electrically conductive contacts outwardly extending from the N-type thin film thermoelectric conduit on the N-designated conductive pad of a first pair of the pairs and the outward extension of a second respective electrically conductive contact of the plurality of electrically conductive contacts outwardly extending from the P-type thin film thermoelectric conduit on the P-designated conductive pad in a second pair of the pairs, where the first pair and the second pair are adjacent to each other, such that all N-type and P-type thin film thermoelectric conduits of the flexible thermoelectric device are connected in series by the electrically conductive lead in each pair and the another electrically conductive leads, each another electrically conductive lead being disposed directly on the top surface of the internal dielectric layer between the outward extension of the first respective electrically conductive contact and the outward extension of the second respective electrically conductive contact; and an upper dielectric layer comprising flexible material on top of the plurality of another electrically conductive leads to provide structure to the flexible thermoelectric device, wherein each N-type thin film thermoelectric conduit and each P-type thin film thermoelectric conduit comprises thermoelectric material no thicker than 50 microns, and wherein the flexible thermoelectric device is bendable to fit a shape of a target platform in which the flexible thermoelectric device is used to harvest thermal energy.

2. The flexible thermoelectric device of claim 1, further comprising:
at least one barrier layer between at least one of:
different thermoelectric materials within at least one of each N-type thin film thermoelectric conduit and each P-type thin film thermoelectric conduit,
an electrically conductive pad of the plurality of electrically conductive pads and the respective N-type or P-type thin film thermoelectric conduit, and
an electrically conductive contact of the plurality of electrically conductive contacts and the respective N-type or P-type thin film thermoelectric conduit,
wherein the at least one barrier layer is electrically conductive and has a higher melting temperature than either of the substances being separated by the at least one barrier layer.

3. The flexible thermoelectric device of claim 1,
wherein at least one of the plurality of electrically conductive pads comprises at least one of a metal cladding, a vacuum deposited metal, a conductive paste, an electroplated layer, and a surface plating layer.

4. The flexible thermoelectric device of claim 1, wherein the flexible material of the lower dielectric layer is doped polyimide or a metal-clad layer.

5. The flexible thermoelectric device of claim 1, wherein the thermoelectric material of each N-type thin film thermoelectric conduit and each P-type thin film thermoelectric conduit is $Bi_2Te_3$, ZnSb, PbTe, $Zn_4Sb_3$, an $AgPb_{18}SbTe_{20}$ filled skutterudite, a $Bi_2Te_3/Sb_2Te_3$ superlattice, PbSeTe/PbTe quantum dots, $Si_{1-x}Ge_x$, $CsBi_4Te_6$, $Yb_{0.19}Co_4Sb_{12}$, or $CeFe_{4+x}Co_xSb_{12}$.

6. The flexible thermoelectric device of claim 1,
wherein at least one of the plurality of electrically conductive contacts comprises at least one of a conductive paste, an electroplated layer, and a surface plating layer.

7. An apparatus comprising:
a flexible thermoelectric device, comprising:
a lower dielectric layer comprising flexible material to provide structure to the flexible thermoelectric device;
a lower conduction layer comprising a plurality of electrically conductive pads disposed directly on and across a surface of the lower dielectric layer, the plurality of electrically conductive pads comprising a plurality of N-designated conductive pads and a plurality of P-designated conductive pads, where the plurality of electrically conductive pads are arranged in pairs such that each pair comprises one N-designated conductive pad of the plurality of N-designated conductive pads and one P-designated conductive pad of the plurality of P-designated conductive pads that are adjacent to one another across the surface of the lower dielectric layer, where the N-designated conductive pad and the P-designated conductive pad in each pair are electrically coupled to one another through an electrically conductive lead extending between the N-designated conductive pad and the P-designated conductive pad adjacent to one another in the pair, the electrically conductive lead extending across the surface of the lower dielectric layer, being parallel to lengths of the N-designated conductive pad and the P-designated conductive pad in the pair, and being narrower in width compared to widths of the N-designated conductive pad and the P-designated conductive pad in the pair, where the widths of the N-designated conductive pad and the P-designated conductive pad are a dimension perpendicular to the length thereof;
a plurality of N-type thin film thermoelectric conduits, each N-type thin film thermoelectric conduit on top of a respective N-designated conductive pad of the plurality of N-designated conductive pads, each N-type thin film thermoelectric conduit having a top surface and a bottom surface, where the bottom surface directly contacts the respective N-designated conductive pad, and the top surface is opposite to the bottom surface;
a plurality of P-type thin film thermoelectric conduits, each P-type thin film thermoelectric conduit on top of a respective P-designated conductive pad of the plurality of P-designated conductive pads, each P-type thin film thermoelectric conduit having a top surface and a bottom surface, where the bottom surface directly contacts the respective P-designated conductive pad, and the top surface is opposite to the bottom surface;
an internal dielectric layer comprising a flexible dielectric material extending across the top surfaces of all the N-type thin film thermoelectric conduits and all the P-type thin film thermoelectric conduits, the internal dielectric layer being electrically insulating, and a surface of the internal dielectric layer being parallel to the top surfaces of each N-type thin film thermoelectric conduit and each P-type thin film thermoelectric conduit;
a thermal insulator to fill a space around each N-type thin film thermoelectric conduit and each P-type thin film thermoelectric conduit, the thermal insulator and the internal dielectric layer being laminated on top of the N-type thin film thermoelectric conduits and the P-type thin film thermoelectric conduits;
a plurality of contact holes extending through the internal dielectric layer and the thermal insulator such that each contact hole extends through a thickness of the internal dielectric layer directly into a thickness of the thermal insulator, and ends on the top surface of the respective N-type thin film thermoelectric conduit or the respective P-type thin film thermoelectric conduit;
a plurality of electrically conductive contacts, each electrically conductive contact fills a respective contact hole of the plurality of contact holes such that each electrically conductive contact extends perpendicularly through the respective contact hole from the top surface of the respective N-type thin film thermoelectric conduit or the respective P-type thin film thermoelectric conduit, through the thermal insulator, and through the thickness of the internal dielectric layer, where each electrically conductive contact includes an outward extension that emerges outward from the respective contact hole above the internal dielectric layer;
a plurality of another electrically conductive leads, each of which bridges between the outward extension of a first respective electrically conductive contact of the plurality of electrically conductive contacts outwardly extending from the N-type thin film thermoelectric conduit on the N-designated conductive pad of a first pair of the pairs and the outward extension of a second respective electrically conductive contact of the plurality of electrically conductive contacts outwardly extending from the P-type thin film thermoelectric conduit on the P-designated conductive pad in a second pair of the pairs, where the first pair and the second pair are adjacent to each other, such that all N-type and P-type thin film thermoelectric conduits of the flexible thermoelectric device are connected in series by the electrically conductive lead in each pair and the another electrically conductive leads, each another electrically conductive lead being disposed directly on the top surface of the internal dielectric layer between the outward extension of the first respective electrically conductive contact and the outward extension of the second respective electrically conductive contact; and an upper dielectric layer comprising flexible material on top of the plurality of another electrically conductive leads to provide structure to the flexible thermoelectric device, wherein each N-type thin film thermoelectric conduit and each P-type thin film thermoelectric conduit comprises thermoelectric material no thicker than 50 microns; and a target platform to which the flexible thermoelectric device is adhered to by way of a thermal adhesive layer affixed to at least one of: the upper dielectric layer and the lower dielectric layer of the flexible thermoelectric device, wherein the flexible thermoelectric device is bendable to fit a shape of the target platform in which the flexible thermoelectric device is used to harvest thermal energy.

8. The apparatus of claim 7, wherein the target platform is one of: a wearable device, a piece of clothing, a piece of jewelry, a sensor, a handheld device, and a building material.

9. The apparatus of claim 7, wherein the flexible thermoelectric device further comprises:
at least one barrier layer between at least one of:
different thermoelectric materials within at least one of each N-type thin film thermoelectric conduit and each P-type thin film thermoelectric conduit,
an electrically conductive pad of the plurality of electrically conductive pads and the respective N-type or P-type thin film thermoelectric conduit, and
an electrically conductive contact of the plurality of electrically conductive contacts and the respective N-type or P-type thin film thermoelectric conduit,
wherein the at least one barrier layer is electrically conductive and has a higher melting temperature than either of the substances being separated by the at least one barrier layer.

10. The apparatus of claim 7,
wherein at least one of the plurality of electrically conductive pads of the flexible thermoelectric device comprises at least one of a metal cladding, a vacuum deposited metal, a conductive paste, an electroplated layer, and a surface plating layer.

11. The apparatus of claim 7, wherein the flexible material of the lower dielectric layer of the flexible thermoelectric device is doped polyimide or a metal-clad layer.

12. The apparatus of claim 7, wherein the thermoelectric material of each N-type thin film thermoelectric conduit and each P-type thin film thermoelectric conduit is $Bi_2Te_3$, ZnSb, PbTe, $Zn_4Sb_3$, an $AgPb_{18}SbTe_{20}$ filled skutterudite, a $Bi_2Te_3/Sb_2Te_3$ superlattice, PbSeTe/PbTe quantum dots, $Si_{1-x}Ge_x$, $CsBi_4Te_6$, $Yb_{0.19}Co_4Sb_{12}$, or $CeFe_{4+x}Co_xSb_{12}$.

13. The apparatus of claim 7,
wherein at least one of the plurality of electrically conductive contacts of the flexible thermoelectric device comprises at least one of a conductive paste, an electroplated layer, and a surface plating layer.

* * * * *